US012785035B2

(12) United States Patent
Ren et al.

(10) Patent No.: US 12,785,035 B2
(45) Date of Patent: Nov. 3, 2026

(54) CHARGED PARTICLE DEVICE, CHARGED PARTICLE ASSESSMENT APPARATUS, MEASURING METHOD, AND MONITORING METHOD

(71) Applicant: ASML NETHERLANDS B.V., Veldhoven (NL)

(72) Inventors: Yan Ren, Eindhoven (NL); Marijke Scotuzzi, Eindhoven (NL); Albertus Victor Gerardus Mangnus, Eindhoven (NL); Erwin Paul Smakman, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 300 days.

(21) Appl. No.: 18/748,758

(22) Filed: Jun. 20, 2024

(65) Prior Publication Data

US 2024/0339292 A1 Oct. 10, 2024

Related U.S. Application Data

(63) Continuation of application No. PCT/EP2022/082825, filed on Nov. 22, 2022.

(51) Int. Cl.
*H01J 37/244* (2006.01)
*H01J 37/10* (2006.01)
*H01J 37/28* (2006.01)

(52) U.S. Cl.
CPC ............ *H01J 37/244* (2013.01); *H01J 37/10* (2013.01); *H01J 37/28* (2013.01)

(58) Field of Classification Search
CPC ........ H01J 37/045; H01J 37/10; H01J 37/244; H01J 37/28
See application file for complete search history.

(56) References Cited

U.S. PATENT DOCUMENTS 7,388,214 B2 * 6/2008 Maeda ................ H01J 37/3177 250/492.23
9,082,588 B2 * 7/2015 Matsumoto ......... H01J 37/3177
(Continued)

FOREIGN PATENT DOCUMENTS

CN 116762152 A 9/2023
EP 3716313 A1 * 9/2020 .......... H01J 37/3177
(Continued)

OTHER PUBLICATIONS

International Search Report issued by the International Searching Authority issued in related International Application No. PCT/EP2022/082825, mailed Jan. 26, 2023.

*Primary Examiner* — David E Smith
(74) *Attorney, Agent, or Firm* — Finnegan, Henderson, Farabow, Garrett & Dunner LLP

(57) ABSTRACT

There is provided a charged particle device for a charged particle inspection apparatus for projecting an array of sub-beams towards a sample, the charged particle device comprising: a charged particle optical element and a detector. The charged particle optical element has an up-beam surface having a plurality of openings to generate an array of sub-beams from a charged particle beam. In the charged particle optical element are defined: sub-beam apertures and monitoring apertures. The sub-beam aperture extend through the charged particle element for paths of the array of sub-beams towards a sample. The monitoring aperture extends through the charged particle element. The detector is in the monitoring aperture. At least part of the detector is down-beam of the up-beam surface. The detector measures a parameter of a portion of the charged particle beam incident on the detector.

15 Claims, 11 Drawing Sheets

(56) References Cited

U.S. PATENT DOCUMENTS

| | | | | |
|---|---|---|---|---|
| 2004/0135102 | A1* | 7/2004 | Muraki | B82Y 10/00 250/397 |
| 2006/0138359 | A1 | 6/2006 | Maeda | |
| 2012/0305798 | A1* | 12/2012 | Zonnevylle | H01J 37/3177 250/397 |
| 2015/0041672 | A1* | 2/2015 | Kamikubo | H01J 37/3177 250/397 |
| 2020/0124546 | A1 | 4/2020 | Hu et al. | |
| 2021/0210306 | A1 | 7/2021 | Zeidler et al. | |
| 2022/0068591 | A1* | 3/2022 | Kakehi | H01J 37/21 |
| 2023/0324318 | A1 | 10/2023 | Ren et al. | |

FOREIGN PATENT DOCUMENTS

| | | | |
|---|---|---|---|
| EP | 3869533 | A1 | 8/2021 |
| EP | 4009349 | A1 | 6/2022 |
| EP | 4256601 | A1 | 10/2023 |
| IL | 303331 | A | 7/2023 |
| KR | 20230113319 | A | 7/2023 |
| TW | 202139239 | A | 10/2021 |
| TW | I815231 | B | 9/2023 |
| TW | 202347399 | A | 12/2023 |
| WO | 2019166331 | A2 | 9/2019 |
| WO | 2019166331 | A3 | 3/2020 |
| WO | 2020193130 | A1 | 10/2020 |
| WO | 2021140035 | A1 | 7/2021 |

* cited by examiner

CHARGED PARTICLE DEVICE, CHARGED PARTICLE ASSESSMENT APPARATUS, MEASURING METHOD, AND MONITORING METHOD

CROSS-REFERENCE TO RELATED APPLICATION

The application claims priority of International application PCT/EP2022/082825, filed on 22 Nov. 2022, which claims priority of EP application Ser. No. 21/216,063.4, filed on 20 Dec. 2021. These applications are incorporated herein by reference in their entireties.

FIELD

The embodiments provided herein generally relate to a charged particle device, a charged particle assessment apparatus, a method for measuring a parameter, and a method for monitoring a parameter.

BACKGROUND

When manufacturing semiconductor integrated circuit (IC) chips, undesired pattern defects often occur on a substrate (i.e. wafer) or a mask during the fabrication processes, thereby reducing the yield. Such defects can occur as a consequence of, for example, optical effects and incidental particles as well as in subsequent processing steps such as etching, deposition or chemical mechanical polishing. Monitoring the extent of the undesired pattern defects is therefore an important process in the manufacture of IC chips. More generally, the inspection and/or measurement of a surface of a substrate, or other object/material, is an important process during and/or after its manufacture.

Pattern inspection tools with a charged particle beam have been used to inspect objects, for example to detect pattern defects. These tools typically use electron microscopy techniques, such as a scanning electron microscope (SEM). In a SEM, a primary electron beam of electrons at a relatively high energy is targeted with a final deceleration step in order to land on a sample at a relatively low landing energy. The beam of electrons is focused as a probing spot on the sample. The interactions between the material structure at the probing spot and the landing electrons from the beam of electrons cause electrons to be emitted from the surface, such as secondary electrons, backscattered electrons, or Auger electrons. The generated secondary electrons may be emitted from the material structure of the sample. By scanning the primary electron beam as the probing spot over the sample surface, secondary electrons can be emitted across the surface of the sample. By collecting these emitted secondary electrons from the sample surface, a pattern inspection tool may obtain an image representing characteristics of the material structure of the surface of the sample.

There may be variation in the uniformity and/or other parameters of the primary electron beam. There is a general need to improve measurement and/or monitoring of a parameter of the primary electron beam.

SUMMARY

According to some embodiments of the present disclosure, there is provided a charged particle device for a charged particle inspection apparatus for projecting an array of sub-beams towards a sample, the charged particle device comprising: a charged particle optical element comprising an up beam surface in which is defined a plurality of openings configured to generate an array of sub-beams from a charged particle beam, in the charged particle optical element are defined; sub-beam apertures through the charged particle element for the array of sub-beams along sub-beam paths towards a sample; and a monitoring aperture extending through the charged particle element; and a detector positioned in the monitoring aperture and at least part of which is down-beam of the up beam surface, wherein the detector is configured to measure a parameter of a portion of the charged particle beam incident on the detector.

According to some embodiments of the present disclosure, there is provided a charged particle device for a charged particle inspection apparatus for projecting an array of sub-beams towards a sample, the charged particle device comprising: an up-beam charged particle optical element comprising an up-beam surface in which is defined a plurality of apertures through the charged particle element configured for alignment with the paths of a plurality of beams, the plurality of beams comprising an array of sub-beams and a monitoring beam; and a down-beam charged particle optical element in which are defined a plurality of apertures configured for alignment with the openings defined in the up-beam charged particle optical element, the apertures comprising: at least one sub-beam aperture through the charged particle element and configured for the paths of the array of sub-beams towards a position of the sample; and a monitoring aperture configured for monitoring the monitoring beam; and a detector comprised within the monitoring aperture and configured to measure a parameter of the corresponding monitoring beam.

According to some embodiments of the present disclosure, there is provided a charged particle device for a charged particle inspection apparatus configured to project an array of sub-beams towards a sample, the charged particle device comprising: an up-beam charged particle optical element in which is defined sub-beam apertures therethrough configured for alignment with paths of the sub-beams of the array of sub-beams towards a sample; a down-beam charged particle optical element in which is defined down-beam sub-beam apertures therethrough, the plurality of apertures configured for alignment with the paths of the sub-beams of the array of sub-beams towards the sample; and an array of detectors configured to measure a parameter of the sub-beams; and an actuating arrangement configured to direct the paths of the sub-beams towards the array of detectors, wherein the array of detectors are positioned radially outward of the down-beam sub-beam apertures.

According to some embodiments of the present disclosure, there is provided a charged particle device for a charged particle inspection apparatus configured to project an array of sub-beams towards a sample, the charged particle device comprising: an up-beam charged particle optical element comprising in which is defined sub-beam apertures therethrough that are configured for alignment with paths of the sub-beams of the array of sub-beams towards a sample; a down-beam charged particle optical element in which is defined a plurality of sub-beam apertures therethrough, the apertures configured for alignment with the sub-beam paths of the array of sub-beams towards the sample; and an array of detectors configured to measure a parameter of the sub-beams; and a deflector device configured to deflect the paths of sub-beams to the array of detectors, a) wherein the array of detectors comprises detector elements between the paths of the sub-beams and the deflector device is configured to operate on all the paths of the sub-beams to deflect the paths of the sub-beams towards the detector in the same direction simultaneously; or b) further comprising a collimator configured to collimate the paths of the sub-beams towards the sample through the down beam charged particle optical element, wherein the deflector array is located between the deflector device and the collimator; or c) wherein the array of detectors are integrated into a collimator desirably a collimator array; or d) wherein the deflector device is a collimator, desirably a collimator array configured to collimate the paths of the sub-beams towards the sample through the down beam charged particle optical element.

According to some embodiments of the present disclosure, there is provided a method of measuring a parameter of a charged particle beam, the method comprising: projecting an array of sub-beams through corresponding openings defined in an up beam surface of a charged particle optical element of a charged particle device, the sub-beams comprising an array of sub-beams and a monitoring beam and the openings comprising a plurality of sub-beam apertures extending through the charged particle optical element and a monitoring aperture extending through the charged particle optical element, wherein the projecting comprising projecting the array of sub-beams along sub-beam paths towards a sample through corresponding sub-beam apertures through the charged particle optical element; and detecting a parameter of the monitoring beam, the detecting comprising using a detector positioned in the monitoring aperture and downbeam of the up beam surface.

According to some embodiments of the present disclosure, there is provided a method of measuring a parameter of a charged particle beam, the method comprising: projecting a plurality of beams through corresponding apertures through an up-beam charged particle optical element of a charged particle device, the plurality of beams comprising an array of sub-beams and a monitoring beam, the projecting further comprising: projecting the array of sub-beams towards a sample through at least one sub-beam aperture defined through a down-beam charged particle optical element; and projecting the monitoring beam towards a detector; and detecting a parameter of the monitoring beam at the detector, wherein the down-beam charged particle optical element comprises the detector.

According to some embodiments of the present disclosure, there is provided a method of measuring a parameter of a charged particle beam, the method comprising: projecting an array of sub-beams along sub-beam paths towards a sample through sub-beam apertures defined in an up-beam charged particle optical element and through sub-beam apertures defined in a down-beam charged particle optical element; directing at least part of the array of sub-beams to an array of detectors using an actuating arrangement; and detecting a parameter of the detected sub-beams, wherein the array of detectors are positioned down beam of the actuating arrangement and radially outward of the sub-beam apertures in the down-beam charged particle optical element.

According to some embodiments of the present disclosure, there is provided a method of measuring a parameter of a charged particle beam, the method comprising: projecting an array of sub-beams along sub-beam paths towards a sample through sub-beam apertures defined in an up-beam charged particle optical element and through sub-beam apertures defined in a down-beam charged particle optical element; deflecting the array of sub-beams to an array of detectors; and detecting a parameter of the detected sub-beams, wherein the array of detectors are positioned down beam of the deflecting between the sub-beam paths.

According to some embodiments of the present disclosure, there is provided a method of monitoring a parameter of a charged particle beam in an assessment apparatus comprising a multi-beam charged particle device, the method comprising: -supporting a sample on a sample support, the sample comprising resist layer, the resist layer facing the multi-beam charged particle device; -exposing the resist layer with the plurality of sub-beams; -processing the sample forming a pattern in the resist layer corresponding to the exposure of the plurality of sub-beams; and -assessing the pattern to determine a parameter of at least one of the plurality of sub-beams.

According to some embodiments of the present disclosure, there is provided a charged particle assessment apparatus for projecting a plurality of sub-beams towards a sample, the apparatus comprising: -a sample support configured to support a sample; -a plurality of charged particle optical elements in which are defined a plurality apertures that are configured for alignment with corresponding apertures in the other charged particle optical element and paths of the plurality of sub-beams towards the sample; a detector configured to detect signal particles from the sample in response to the plurality of sub-beams for assessment of the sample, wherein the assessment apparatus is configured to expose a resist coated sample so as to monitor one or more parameters of one or more of the sub-beams.

BRIEF DESCRIPTION OF FIGURES

The above and other aspects of the present disclosure will become more apparent from the description of exemplary embodiments, taken in conjunction with the accompanying drawings.

DETAILED DESCRIPTION

Figure 1:
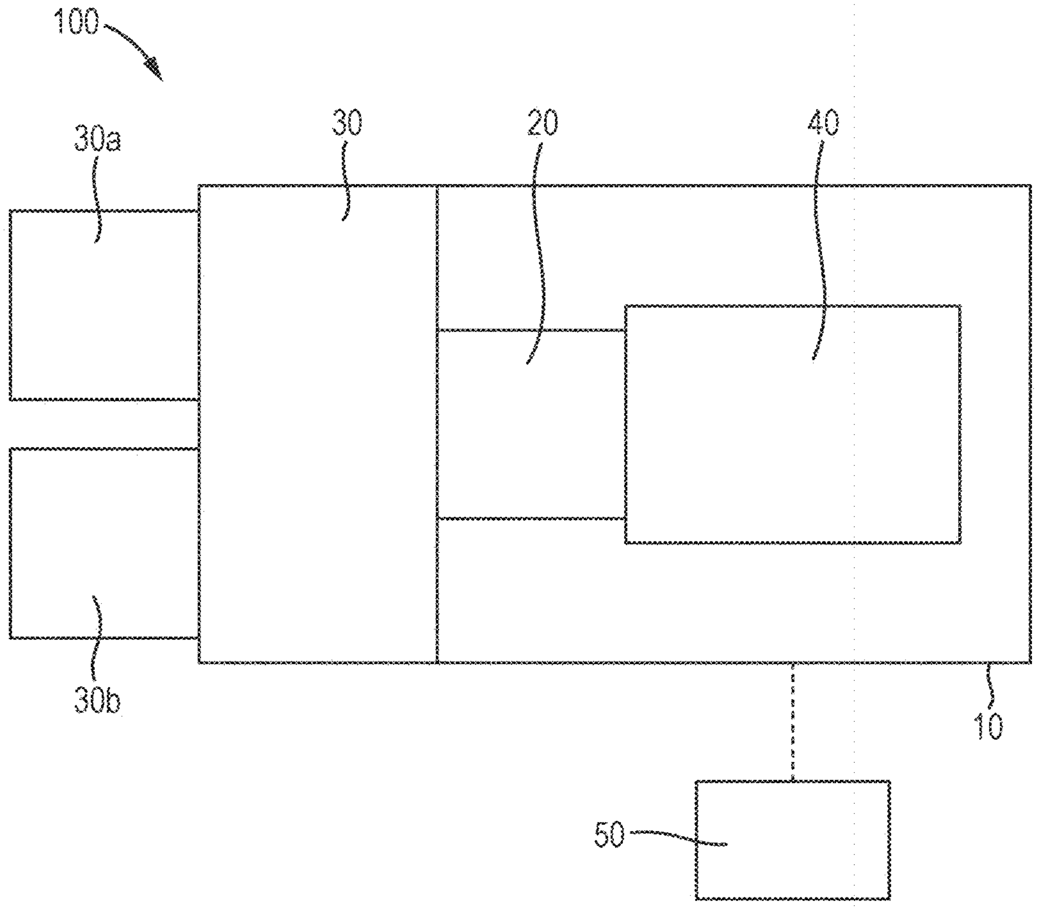
FIG. 1 is a schematic diagram illustrating an exemplary charged particle beam inspection apparatus.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims.

The enhanced computing power of electronic devices, which reduces the physical size of the devices, can be accomplished by significantly increasing the packing density of circuit components such as transistors, capacitors, diodes, etc. on an IC chip. This has been enabled by increased resolution enabling yet smaller structures to be made. For example, an IC chip of a smart phone, which is the size of a thumbnail and available in, or earlier than, 2019, may include over 2 billion transistors, the size of each transistor being less than 1/1000th of a human hair. Thus, it is not surprising that semiconductor IC manufacturing is a complex and time-consuming process, with hundreds of individual steps. Errors in even one step have the potential to dramatically affect the functioning of the final product. Just one defect can cause device failure. The goal of the manufacturing process is to improve the overall yield of the process. For example, to obtain a 75% yield for a 50-step process (where a step can indicate the number of layers formed on a wafer), each individual step must have a yield greater than 99.4%. If each individual step had a yield of 95%, the overall process yield would be as low as 7%.

While high process yield is desirable in an IC chip manufacturing facility, maintaining a high substrate (i.e. wafer) throughput, defined as the number of substrates processed per hour, is also essential. High process yield and high substrate throughput can be impacted by the presence of a defect. This is especially if operator intervention is required for reviewing the defects. Thus, high throughput detection and identification of micro and nano-scale defects by inspection tools (such as a Scanning Electron Microscope ('SEM')) is essential for maintaining high yield and low cost.

A SEM comprises a scanning device and a detector apparatus for sensing a signal from a sample. The scanning device comprises an illumination apparatus that comprises an electron source, for generating primary electrons, and a projection apparatus for scanning a sample, such as a substrate, with one or more focused beams of primary electrons. Together at least the illumination apparatus, or illumination system, and the projection apparatus, or projection system, may be referred to together as the electron-optical system or apparatus. The primary electrons interact with the sample and generate secondary electrons. The detection apparatus captures the secondary electrons from the sample as the sample is scanned so that the SEM can create an image of the scanned area of the sample. For high throughput inspection, some of the inspection apparatuses use multiple focused beams, i.e. a multi-beam, of primary electrons. The component beams of the multi-beam may be referred to as sub-beams or beamlets. A multi-beam can scan different parts of a sample simultaneously. A multi-beam inspection apparatus can therefore inspect a sample at a much higher speed than a single-beam inspection apparatus.

An implementation of a known multi-beam inspection apparatus is described below.

The figures are schematic. Relative dimensions of components in drawings are therefore exaggerated for clarity. Within the following description of drawings the same or like reference numbers refer to the same or like components or entities, and only the differences with respect to the individual embodiments are described. While the description and drawings are directed to an electron-optical apparatus, it is appreciated that the embodiments are not used to limit the present disclosure to specific charged particles. References to electrons throughout the present document may therefore be more generally be considered to be references to charged particles, with the charged particles not necessarily being electrons.

Reference is now made to FIG. 1, which is a schematic diagram illustrating an exemplary charged particle beam inspection apparatus 100. The charged particle beam inspection apparatus 100 (or charged particle beam apparatus 100) of FIG. 1 includes a main chamber 10, a load lock chamber 20, an electron beam tool 40, an equipment front end module (EFEM) 30 and a controller 50. Electron beam apparatus 40 is located within main chamber 10.

EFEM 30 includes a first loading port 30*a* and a second loading port 30*b*. EFEM 30 may include additional loading port(s). First loading port 30*a* and second loading port 30*b* may, for example, receive substrate front opening unified pods (FOUPs) that contain substrates (e.g., semiconductor substrates or substrates made of other material(s)) or samples to be inspected (substrates, wafers and samples are collectively referred to as "samples" hereafter). One or more robot arms (not shown) in EFEM 30 transport the samples to load lock chamber 20.

Load lock chamber 20 is used to remove the gas around a sample. This creates a vacuum that is a local gas pressure lower than the pressure in the surrounding environment. The load lock chamber 20 may be connected to a load lock vacuum pump system (not shown), which removes gas particles in the load lock chamber 20. The operation of the load lock vacuum pump system enables the load lock chamber to reach a first pressure below the atmospheric pressure. After reaching the first pressure, one or more robot arms (not shown) transport the sample from load lock chamber 20 to main chamber 10. Main chamber 10 is connected to a main chamber vacuum pump system (not shown). The main chamber vacuum pump system removes gas particles in main chamber 10 so that the pressure in around the sample reaches a second pressure lower than the first pressure. After reaching the second pressure, the sample is transported to the electron beam tool by which it may be inspected. An electron beam apparatus 40 may comprise a multi-beam electron-optical apparatus.

Controller 50 is electronically connected to electron beam apparatus 40. Controller 50 may be a processor (such as a computer) configured to control the charged particle beam apparatus 100. Controller 50 may also include a processing circuitry configured to execute various signal and image processing functions. While controller 50 is shown in FIG. 1 as being outside of the structure that includes main chamber 10, load lock chamber 20, and EFEM 30, it is appreciated that controller 50 may be part of the structure. The controller 50 may be located in one of the component elements of the charged particle beam inspection apparatus or it can be distributed over at least two of the component elements. While the present disclosure provides examples of main chamber 10 housing an electron beam inspection tool, it should be noted that aspects of the disclosure in their broadest sense are not limited to a chamber housing an electron beam inspection tool. Rather, it is appreciated that the foregoing principles may also be applied to other tools and other arrangements of apparatus, that operate under the second pressure.

Figure 2:
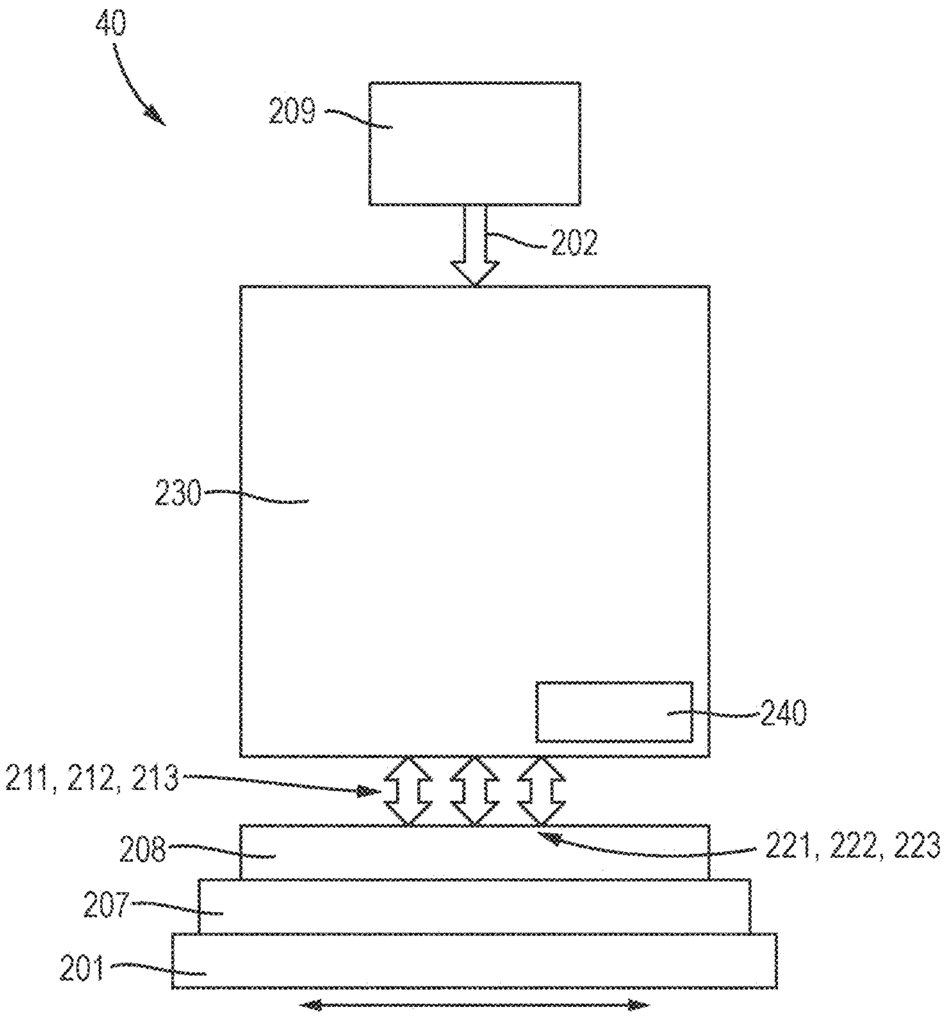
FIG. 2 is a schematic diagram illustrating an exemplary multi-beam apparatus that is part of the exemplary charged particle beam inspection apparatus of FIG. 1.

Reference is now made to FIG. 2, which is a schematic diagram illustrating an exemplary electron beam apparatus 40 including a multi-beam inspection tool that is part of the exemplary charged particle beam apparatus 100 of FIG. 1. Multi-beam electron beam apparatus 40 (also referred to herein as tool 40) comprises an electron source 201, a projection apparatus 230, an actuated stage 209, and a sample holder 207. The electron source 201 and projection apparatus 230 may together be referred to as an illumination apparatus. The sample holder 207 is supported by motorized stage 209 so as to hold a sample 208 (e.g., a substrate or a mask) for inspection. Multi-beam electron beam apparatus 40 further comprises an electron detection device 240.

Electron source 201 may comprise a cathode (not shown) and an extractor or anode (not shown). During operation, electron source 201 is configured to emit electrons as primary electrons from the cathode. The primary electrons are extracted or accelerated by the extractor and/or the anode to form a primary electron beam 202.

Projection apparatus 230 is configured to convert primary electron beam 202 into a plurality of sub-beams 211, 212, 213 and to direct each sub-beam onto the sample 208. Although three sub-beams are illustrated for simplicity, there may be many tens, many hundreds, or many thousands of sub-beams. The sub-beams may be referred to as beamlets.

Controller 50 may be connected to various parts of charged particle beam apparatus 100 of FIG. 1, such as electron source 201, electron detection device 240, projection apparatus 230, and motorized stage 209. Controller 50 may perform various image and signal processing functions. Controller 50 may also generate various control signals to govern operations of the charged particle beam inspection apparatus, including the charged particle multi-beam apparatus.

Projection apparatus 230 may be configured to focus sub-beams 211, 212, and 213 onto a sample 208 for inspection and may form three probe spots 221, 222, and 223 on the surface of sample 208. Projection apparatus 230 may be configured to deflect primary sub-beams 211, 212, and 213 to scan probe spots 221, 222, and 223 across individual scanning areas in a section of the surface of sample 208. In response to incidence of primary sub-beams 211, 212, and 213 on probe spots 221, 222, and 223 on sample 208, electrons are generated from the sample 208 which include secondary electrons and backscattered electrons. The secondary electrons typically have electron energy≤50 eV and backscattered electrons typically have electron energy between 50 eV and the landing energy of primary sub-beams 211, 212, and 213.

Electron detection device 240 is configured to detect secondary electrons and/or backscattered electrons (also known as signal particles) and to generate corresponding signals which are sent to controller 50 or a signal processing system (not shown), e.g. to construct images of the corresponding scanned areas of sample 208. Desirably, electron detection device is incorporated into the projection apparatus. Alternatively it may be separate therefrom, with a secondary electron-optical column being provided to direct secondary electrons and/or backscattered electrons to the electron detection device.

The controller 50 may comprise image processing system that includes an image acquirer (not shown) and a storage device (not shown). For example, the controller may comprise a processor, computer, server, mainframe host, terminals, personal computer, any kind of mobile computing devices, and the like, or a combination thereof. The image acquirer may comprise at least part of the processing function of the controller. Thus the image acquirer may comprise at least one or more processors. The image acquirer may be communicatively coupled to an electron detection device 240 of the apparatus 40 permitting signal communication, such as an electrical conductor, optical fiber cable, portable storage media, IR, Bluetooth, internet, wireless network, wireless radio, among others, or a combination thereof. The image acquirer may receive a signal from electron detection device 240, may process the data comprised in the signal and may construct an image therefrom. The image acquirer may thus acquire images of sample 208. The image acquirer may also perform various post-processing functions. The storage may be any suitable storage medium. The storage may be coupled with the image acquirer and may be used for saving scanned raw image data as original images, and post-processed images.

The image acquirer may acquire one or more images of a sample based on an imaging signal received from the electron detection device 240. An imaging signal may correspond to a scanning operation for conducting charged particle imaging. An acquired image may be a single image comprising a plurality of imaging areas. The single image may be stored in the storage. The single image may be an original image that may be divided into a plurality of regions. Each of the regions may comprise one imaging area containing a feature of sample 208. The acquired images may comprise multiple images of a single imaging area of sample 208 sampled multiple times over a time period. The multiple images may be stored in the storage. The controller 50 may be configured to perform image processing steps with the multiple images of the same location of sample 208.

The controller 50 may include measurement circuitry (e.g., analog-to-digital converters) to obtain a distribution of the detected secondary electrons. The electron distribution data, collected during a detection time window, can be used in combination with corresponding scan path data of each of primary sub-beams 211, 212, and 213 incident on the sample surface, to reconstruct images of the sample structures under inspection. The reconstructed images can be used to reveal various features of the internal or external structures of sample 208. The reconstructed images can thereby be used to reveal any defects that may exist in the sample.

The controller 50 may control actuated stage 209 to move sample 208 during inspection of sample 208. The controller 50 may enable actuated stage 209 to move sample 208 in a direction, for example continuously, for example at a constant speed, at least during sample inspection. The controller 50 may control movement of the actuated stage 209 so that it changes the speed of the movement of the sample 208 dependent on various parameters. For example, the controller may control the stage speed (including its direction) depending on the characteristics of the inspection steps of scanning process.

Figure 3:
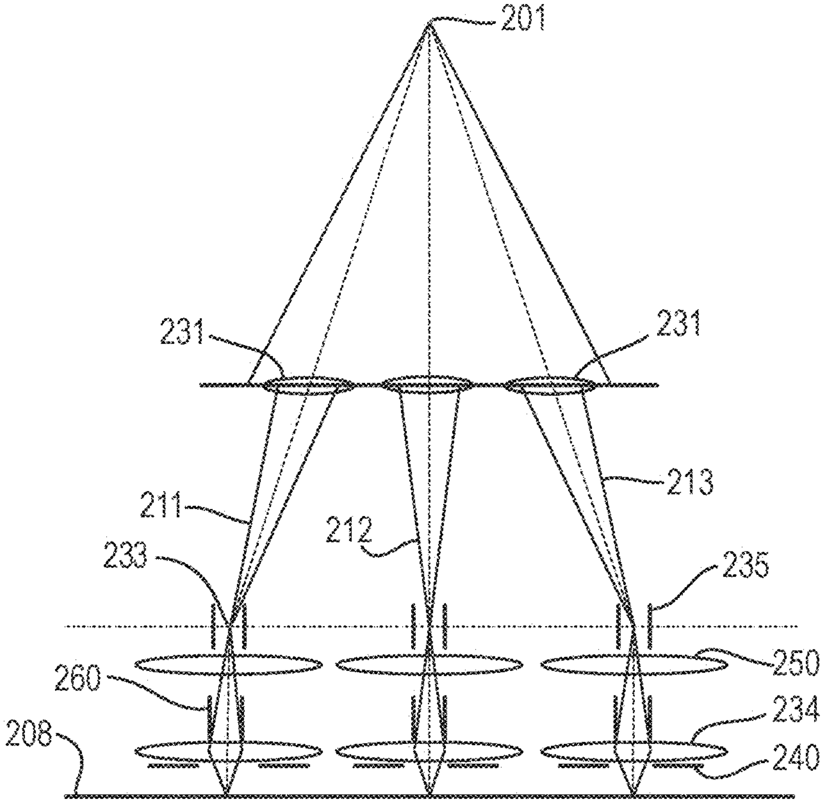
FIG. 3 is a schematic diagram of exemplary multi-beam apparatus according to some embodiments of the present disclosure.

FIG. 3 is a schematic diagram of an assessment tool comprising an electron source 201 and an electron optical column (or electron optical device). (In another arrangement the source is part of the electron-optical column). The electron optical device comprises a plurality of electron optical elements. An electron optical element is any element that affects (e.g. directs, shapes, or focuses) an electron beam and may use electric and/or magnetic fields. Electron source 201 directs electrons toward an array of condenser lenses 231 forming part of the electron optical column. The electron source is desirably a high brightness thermal field emitter with a good compromise between brightness and total emission current. There may be many tens, many hundreds, or many thousands of condenser lenses 231. Condenser lenses 231 may comprise multi-electrode lenses and have a construction based on EP1602121A1, which document is hereby incorporated by reference in particular to the disclosure of a lens array to split an e-beam into a plurality of sub-beams, with the array providing a lens for each sub-beam. The condenser lens array therefore functions as a beam divider, beam splitter, beam generator or beam separator. The condenser lens array may take the form of at least two plates, acting as electrodes, with an aperture in each plate aligned with each other and corresponding to the location of a path of a sub-beam. At least two of the plates are maintained during operation at different potentials to achieve the desired lensing effect. The plates therefore have an array of apertures, each aperture corresponding to the path of a sub-beam. The plate positioned most up beam is the beam separator and may referred to as a beam limiting aperture. In a different arrangement the beam separator may be part of or associated with the condenser lens array, with a separate function form lensing the sub-beams.

In an arrangement the condenser lens array is formed of three plate arrays in which charged particles have the same energy as they enter and leave each lens, which arrangement may be referred to as an Einzel lens. The beam energy is the same on entering as leaving the Einzel lens. Thus, dispersion only occurs within the Einzel lens itself (between entry and exit electrodes of the lens), thereby limiting off-axis chromatic aberrations. When the thickness of the condenser lenses is low, e.g. a few mm, such aberrations have a small or negligible effect.

Each condenser lens in the array directs electrons into a respective sub-beam 211, 212, 213 which is focused at a respective intermediate focus 233. The sub-beams diverge with respect to each other. At the intermediate focuses 233 are deflectors 235. The deflectors 235 are positioned in the beamlet paths at, or at least around, the position of the corresponding intermediate focusses 233 or focus points (i.e. points of focus). The deflectors are positioned in the beamlet paths at the intermediate image plane of the associated beamlet, i.e. at its focus or focus point. The deflectors 235 are configured to operate on the respective beamlets 211, 212, 213. Deflectors 235 are configured to bend a respective beamlet 211, 212, 213 by an amount effective to ensure that the principal ray (which may also be referred to as the beam axis) is incident on the sample 208 substantially normally (i.e. at substantially 90° to the nominal surface of the sample). Deflectors 235 may also be referred to as collimators or collimator deflectors. The deflectors 235 in effect collimate the paths of the beamlets so that before the deflectors, the beamlets paths with respect to each other are diverging. Down beam of the deflectors the beamlet paths are substantially parallel with respect to each other, i.e. substantially collimated. Suitable collimators are deflectors disclosed in EP Application Ser. No. 20/156,253.5 filed on 7 Feb. 2020 which is hereby incorporated by reference with respect to the application of the deflectors to a multi-beam array.

Below (i.e. downbeam or further from source 201) deflectors 235 there is a control lens array 250 comprising a control lens 251 for each sub-beam 211, 21, 213. Control lens array 250 may comprise at least two, for example three, plate electrode arrays connected to respective potential sources. A function of control lens array 250 is optimize the beam opening angle with respect to the demagnification of the beam and/or to control the beam energy delivered to objective lenses 234, each of which directs a respective sub-beam 211, 212, 213 onto the sample 208. The objective lenses 234 are in an objective lens array 241. The control lenses pre-focus the sub-beams (e.g. apply a focusing action to the sub-beams prior to the sub-beams reaching the objective lens array 241). The pre-focusing may reduce divergence of the sub-beams or increase a rate of convergence of the sub-beams. The control lens array and the objective lens array operate together to provide a combined focal length. Combined operation without an intermediate focus may reduce the risk of aberrations. Note that the reference to demagnification and opening angle is intended to refer to variation of the same parameter. In an ideal arrangement the product of demagnification and the corresponding opening angle is constant over a range of values.

The control lens array 250 may be considered as providing electrodes additional to the electrodes of the objective lens array for example. The objective lens array may have any number of additional electrodes associated and proximate to the objective lens array. The additional electrodes such as of the control lens array 250 allow further degrees of freedom for controlling the electron-optical parameters of the sub-beams. Such additional associated electrodes may be considered to be additional electrodes of the objective lens array enabling additional functionality of the respective objective lenses of the objective lens array. In an arrangement such electrodes may be considered part of the objective lens array providing additional functionality to the objective lenses of the objective lens array. Thus, the control lens is considered to be part of the corresponding objective lens, even to the extent that the control lens is only referred to as being a part of the objective lens.

The objective lenses 234 are arranged in an objective lens array such as the objective lens array 241. Objective lenses 234 can be configured to demagnify the electron beam by a factor greater than 10, desirably in the range of 50 to 100 or more. The objective lenses 234 may be Einzel lenses. At least the chromatic aberrations generated in a beam by a condenser lens and the corresponding downbeam objective lens may mutually cancel.

Each plate electrode of the objective lens array is desirably mechanically connected to, and electrically separated from, an adjacent plate electrode array by an isolating element, such as a spacer which may comprise ceramic or glass. Such a spacer may mechanically connect adjacent electrode plates and electrically isolate the adjacent electrode plates. The isolating element may otherwise be referred to as an insulating structure and may be provided to separate any adjacent electrodes provided. If more than two electrodes are provided, multiple isolating elements (i.e. insulating structures) may be provided. For example, there may be a sequence of insulating structures. The isolating spacer may be present between any other electron-optical elements of the electron optical device 240.

An electron detection device 240 is provided between the objective lenses 234 and the sample 208 to detect secondary and/or backscattered electrons emitted from the sample 208. An exemplary construction of the electron detection system is described below.

Optionally an array of scan deflectors 260 is provided between the control lens array 250 and the array of objective lenses 234. The array of scan deflectors 260 comprises a scan deflector 261 for each sub-beam 211, 212, 213. Each scan deflector is configured to deflect a respective sub-beam 211, 212, 213 in one or two directions so as to scan the sub beam across the sample 208 in one or two directions.

The system of FIG. 3 can be configured to control the landing energy of the electrons on the sample. The landing energy can be selected to increase emission and detection of secondary electrons dependent on the nature of the sample being assessed. A controller provided to control the objective lenses 234 may be configured to control the landing energy by varying the potentials applied to the electrodes of the control lenses and the objective lenses. The control lenses and objective lenses work together and may be referred to as an objective lens assembly. The landing energy can be selected to increase emission and detection of secondary electrons dependent on the nature of the sample being assessed. A controller may be configured to control the landing energy to any desired value within a predetermined range or to a desired one of a plurality of predetermined values.

Desirably, the landing energy is primarily varied by controlling the energy of the electrons exiting the control lens. The potential differences within the objective lenses are desirably kept constant during this variation so that the electric field within the objective lens remains as high as possible. The potentials applied to the control lens in addition may be used to optimize the beam opening angle and demagnification. The use of the control lens array enables the objective lens array to be operated at its optimal electric field strength. Details of electrode structures and potentials that can be used to control landing energy are disclosed in EPA 20158804.3, which document is incorporated herein by reference.

Figure 4:
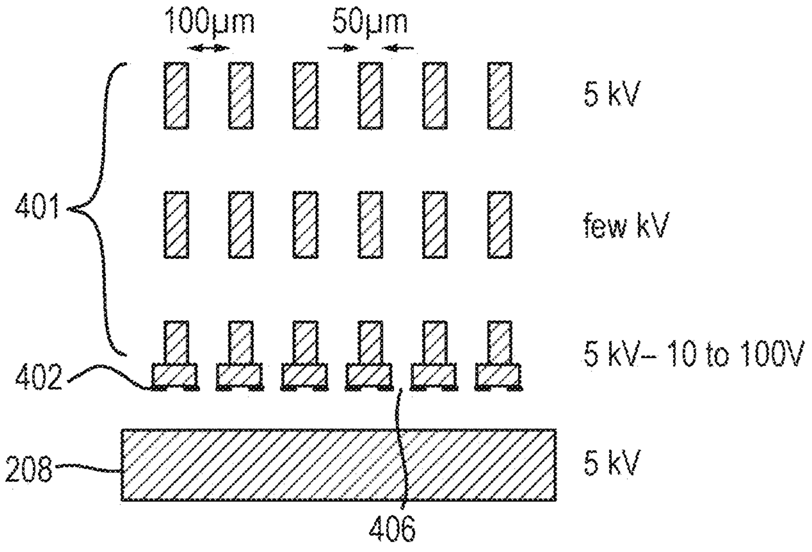
FIG. 4 is a schematic cross-sectional view of an objective lens of an inspection apparatus according to some embodiments of the present disclosure.

The landing energy of the electrons may be controlled in the system of FIG. 4 because any off-axis aberrations generated in the beamlet path are generated in, or at least mainly in, the condenser lenses 231. The objective lenses 234 of the system shown in FIG. 3 need not be Einzel lenses. This is because, as the beams are collimated, off-axis aberrations would not be generated in the objective lenses. The off-axis aberrations can be controlled better in the condenser lenses than in the objective lenses 234.

In some embodiments, the charged particle assessment tool further comprises one or more aberration correctors that reduce one or more aberrations in the sub-beams. In some embodiments, each of at least a subset of the aberration correctors is positioned in, or directly adjacent to, a respective one of the intermediate foci (e.g. in or adjacent to the intermediate image plane). The sub-beams have a smallest sectional area in or near a focal plane such as the intermediate plane. This provides more space for aberration correctors than is available elsewhere, i.e. upbeam or downbeam of the intermediate plane (or than would be available in alternative arrangements that do not have an intermediate image plane).

In some embodiments, aberration correctors positioned in, or directly adjacent to, the intermediate foci (or intermediate image plane or focus points) comprise deflectors to correct for the source 201 appearing to be at different positions for different beams. Correctors can be used to correct macroscopic aberrations resulting from the source that prevent a good alignment between each sub-beam and a corresponding objective lens. In some circumstances it is desirable to position the correctors as far upbeam as possible. In this way, a small angular correction can effect a large displacement at the sample so that weaker correctors can be used. Desirably the correctors are positioned to minimize introduction of additional aberrations. Additionally or alternatively other non-uniformities in the source beam may be corrected; that is aberrations in the source beam uniformity may be corrected.

The aberration correctors may correct other aberrations that prevent a proper column alignment. Such aberrations may also lead to a misalignment between the sub-beams and the correctors. For this reason, it may be desirable to additionally or alternatively position aberration correctors at or near the condenser lenses 231 (e.g. with each such aberration corrector being integrated with, or directly adjacent to, one or more of the condenser lenses 231). This is desirable because at or near the condenser lenses 231 aberrations will not yet have led to a shift of corresponding sub-beams because the condenser lenses 231 are vertically close or coincident with the beam apertures. That is, correction by the corrector of any angular error will require a smaller positional shift than if the corrector is positioned further downbeam. Correcting such aberrations further downbeam such as at the intermediate foci may be impacted by misalignment between the sub-beams 211, 212, 213 and the correctors. A challenge with positioning correctors at or near the condenser lenses 231, however, is that the sub-beams each have relatively large sectional areas and relatively small pitch at this location, relative to locations further downbeam. In situations with volume restrictions, the corrector array or additional corrector arrays may be located away from these preferred locations, such as between the condenser lens array and the intermediate focus positions.

In some embodiments, each of at least a subset of the aberration correctors is integrated with, or directly adjacent to, one or more of the objective lenses 234. In some embodiments, these aberration correctors reduce one or more of the following: field curvature; focus error; and astigmatism. Additionally or alternatively, one or more scanning deflectors (not shown) may be integrated with, or directly adjacent to, one or more of the objective lenses 234 for scanning the sub-beams 211, 212,214 over the sample 208. In some embodiments, the scanning deflectors described in US 2010/0276606, which document is hereby incorporated by reference in its entirety, may be used.

The aberration correctors may be CMOS based individual programmable deflectors as disclosed in EP2702595A1 or an array of multipole deflectors as disclosed EP2715768A2, of which the descriptions of the beamlet manipulators in both documents are hereby incorporated by reference. There may be an aberration corrector of this design for each beamlet, i.e. an individual beamlet corrector. The individual beamlet correctors may be in an array across the multi-beam, which may be referred to as a corrector array.

The bottom electrode of the objective lens is a CMOS chip detector integrated into a multi-beam manipulator array. Integration of a detector array into the objective lens replaces a secondary column of other electron-optical designs. (Note: to avoid ambiguity from monitoring detectors, the detector array described here is for sensing signal particles and may be referred to as a sensor which may be referred to as a sensor array) The CMOS chip is desirably orientated to face the sample (because of the small distance (e.g. 100 μm) between sample and bottom of the electron-optical system). In some embodiments, capture electrodes to capture the secondary electron signals are provided. The capture electrodes can be formed in the metal layer of, for example, a CMOS device. The capture electrode may form the bottom layer of the objective lens. The capture electrode may form the bottom surface in a CMOS chip. The CMOS chip may be a CMOS chip detector. The CMOS chip may be integrated into the sample facing surface of an objective lens assembly. The capture electrodes are examples of sensor units for detecting secondary electrons. The capture electrodes can be formed in other layers. Power and control signals of the CMOS may be connected to the CMOS by through-silicon vias. For robustness, desirably the bottom electrode consist of two elements: the CMOS chip and a passive Si plate with holes. The plate shields the CMOS from high E-fields.

Sensor units associated with bottom or sample facing surface of an objective lens are beneficial because the secondary and/or back-scatted electrons may be detected before the electrons encounter and become manipulated by an electron optical element of the electron-optical system. Beneficially the time taken for detection of such a sample emanating electron may be reduced desirably minimized.

In order to maximize the detection efficiency it is desirable to make the electrode surface as large as possible, so that substantially all the area of the array objective lens (excepting the apertures) is occupied by electrodes and each electrode has a diameter substantially equal to the array pitch. In some embodiments, the outer shape of the electrode is a circle, but this can be made a square to maximize the detection area. Also the diameter of the through-substrate hole can be minimized. Typical size of the electron beam is in the order of 5 to 15 micron.

In some embodiments, a single capture electrode surrounds each aperture. In some embodiments, a plurality of electrode elements is provided around each aperture. The electrode elements are examples of sensor elements. The electrons captured by the electrode elements surrounding one aperture may be combined into a single signal or used to generate independent signals. The electrode elements may be divided radially (i.e. to form a plurality of concentric annuluses), angularly (i.e. to form a plurality of sector-like pieces), both radially and angularly or in any other convenient manner.

However a larger electrode surface leads to a larger parasitic capacitance, so a lower bandwidth. For this reason it may be desirable to limit the outer diameter of the electrode. Especially in case a larger electrode gives only a slightly larger detection efficiency, but a significantly larger capacitance. A circular (annular) electrode may provide a good compromise between collection efficiency and parasitic capacitance.

A larger outer diameter of the electrode may also lead to a larger crosstalk (sensitivity to the signal of a neighboring hole). This can also be a reason to make the electrode outer diameter smaller, especially if a larger electrode gives only a slightly larger detection efficiency, but a significantly larger crosstalk.

The signal particles e.g. back-scattered and/or secondary electron collected by electrode as current is amplified. The purpose of the amplifier is to enable sufficiently sensitive measurement of the current received or collected by the sensor unit to be measured and thus the number of back-scattered and/or secondary electrons. This can be measured by current measurements or the potential difference over a resistor. Several types of amplifier design may be used to amplify back-scattered and/or secondary electron current collected by electrode for example a Trans Impedance Amplifier. Other types of detector such as electron to photon converter (e.g. scintillator) and semiconductor detector (e.g. PIN detector) may be used in place of or in combination with a current detector. Such European patent publication EP 3852127 filed on 23 Dec. 2020 and European applications 21183811, 21183804.0; and 21183803.2 filed 5 Jul. 2021 which are hereby incorporated by reference with respect to the different detector arrangements and combinations.

Figure 5:
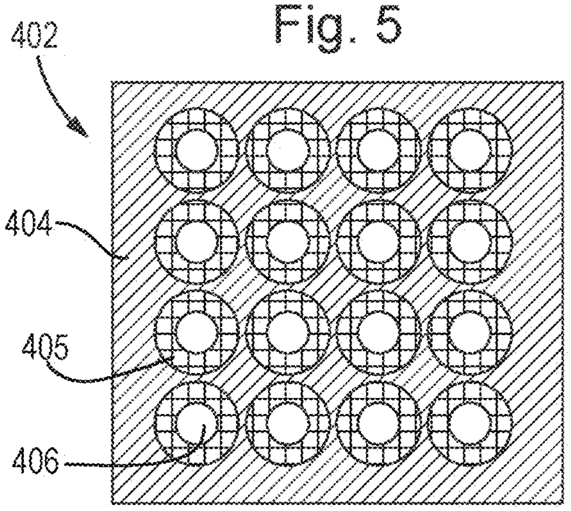
FIG. 5 is a bottom view of the objective lens of FIG. 4.
Figure 6:
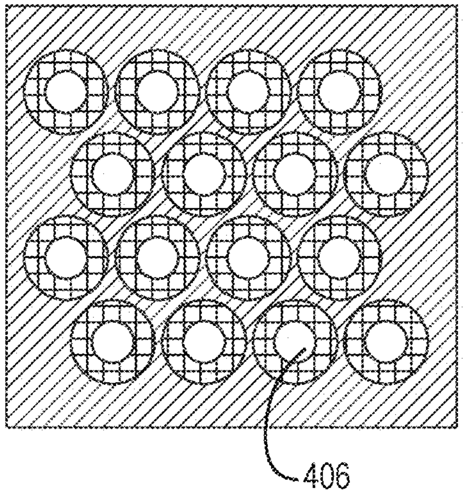
FIG. 6 is a bottom view of a modification of the objective lens of FIG. 4.

An example is shown in FIG. 4 which illustrates a multibeam objective lens 401 in schematic cross section. On the output side of the objective lens 401, the side facing the sample 208, a detector module 402 (or sensor module 402) is provided. Detector module 402 is an example of an electron detection device. FIG. 5 is a bottom view of detector module 402 which comprises a substrate 404 on which are provided a plurality of capture electrodes 405 each surrounding a beam aperture 406. Beam apertures 406 are large enough not to block any of the primary electron beams. Capture electrodes 405 can be considered as examples of sensor units which receive back-scattered or secondary electrodes and generate a detection signal, in this case an electric current. The beam apertures 406 may be formed by etching through substrate 404. In the arrangement shown in FIG. 5, the beam apertures 406 are shown in a rectangular array. The beam apertures 406 can also be differently arranged, e.g. in a hexagonal close packed array as depicted in FIG. 6.

Figure 7:
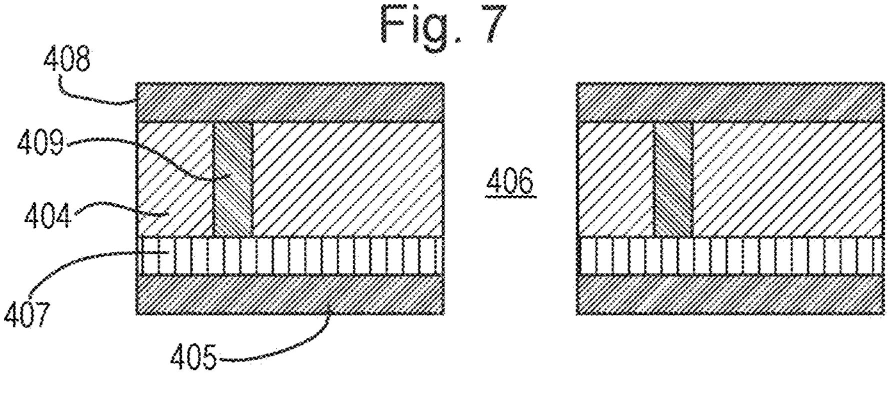
FIG. 7 is an enlarged schematic cross-sectional view of a sensing detector incorporated in the objective lens of FIG. 4.

FIG. 7 depicts at a larger scale a part of the detector module 402 in cross section. Capture electrodes 405 form the bottommost, i.e. most close to the sample, surface of the detector module 402. In operation, the array of capture electrodes 405 face the sample 208. Between the capture electrodes 405 and the main body of the silicon substrate 404 a logic layer 407 is provided. Logic layer 407 may include amplifiers, e.g. Trans Impedance Amplifiers, analogue to digital converters, and readout logic. In some embodiments, there is one amplifier and one analogue to digital converter per capture electrode 405. Logic layer 407 and capture electrodes 405 can be manufactured using a CMOS process with the capture electrodes 405 forming the final metallization layer.

A wiring layer 408 is provided on the backside of substrate 404 and connected to the logic layer 407 by through-silicon vias 409. The number of through-silicon vias 409 need not be the same as the number of beam apertures 406. In particular if the electrode signals are digitized in the logic layer 407 only a small number of through-silicon vias may be required to provide a data bus. Wiring layer 408 can include control lines, data lines and power lines. It will be noted that in spite of the beam apertures 406 there is ample space for all necessary connections. The detection module 402 can also be fabricated using bipolar or other manufacturing techniques. A printed circuit board and/or other semiconductor chips may be provided on the backside of detector module 402.

FIG. 4 depicts a three-electrode objective lens but it will be appreciated that any other form of objective lens with as many electrodes including associated electrodes as required, e.g. a two-electrode lens, may also be used.

Figure 8:
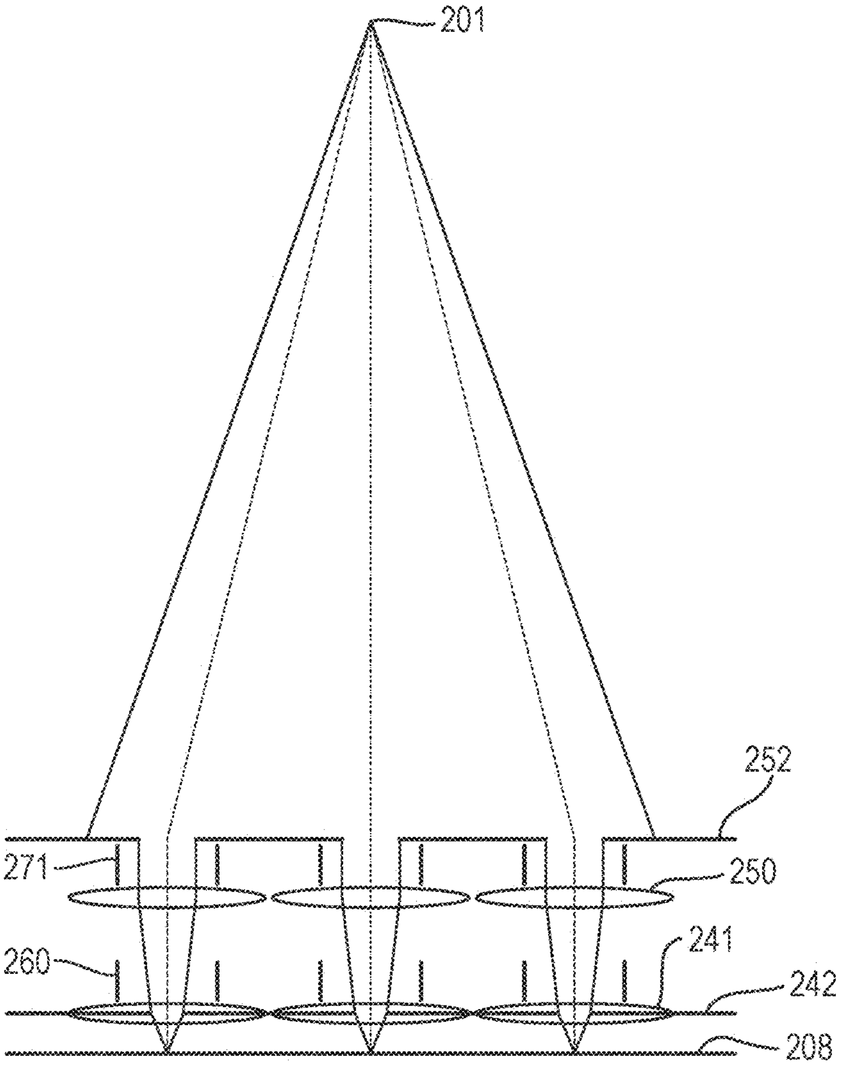
FIG. 8 is a schematic side view of an array of correctors.

FIG. 8 is a schematic diagram of another design of exemplary electron-optical system. The electron-optical system may comprise a source 201 and electron-optical device comprising a plurality of electron optical elements; alternatively the electron optical device comprises the source 201. The electron optical device may comprise an objective array assembly as shown and described with respect to FIG. 3. Such an objective array assembly may feature a control lens array 250, an objective lens array 241, and a detector array. Although not shown in FIG. 8, the system may further comprise an electron detection device (such as electron detection device 240 shown in FIG. 3).

In the present arrangement depicted in FIG. 8 the objective lens array may also feature an upper beam limiter 252, a collimator element array 271, a scan deflector array 260, and a beam shaping limiter 242. (Note in a different arrangement the electron optical device comprises these features without them being arranged in a common lens assembly.) The source 201 provides a beam of charged particles (e.g. electrons). The multi-beam focused on the sample 208 is derived from the beam provided by the source 201. Sub-beams may be derived from the beam, for example, using a beam limiter defining an array of beam-limiting apertures, e.g. the upper beam limiter 252.

The upper beam limiter 252, may comprise a plate, that defines an array of beam-limiting apertures and functions as a beam separator or sub-beam generator. The upper beam limiter 252 forms the sub-beams from the beam of charged particles emitted by the source 201. Portions of the beam other than those contributing to forming the sub-beams may be blocked (e.g. absorbed) by the upper beam limiter 252 so as not to interfere with the sub-beams down-beam. The upper beam limiter 252 may be referred to as a sub-beam defining aperture array.

The collimator element array 271 is provided down-beam of the upper beam limiter. Each collimator element collimates a respective sub-beam. The collimator element array 271 may be formed be spatially compact which may be achieved by MEMS processing. In some embodiments, exemplified in FIG. 3, the collimator element array 271 is the first deflecting or focusing electron-optical array element in the beam path down-beam of the source 201. In another arrangement, the collimator may take the form, wholly or partially, of a macro-collimator (not shown). Such a macro-collimator may be up beam of the upper beam limiter 252. Thus the macro-collimator operates on the beam from the source before generation of the multi-beam. A magnetic lens may be used as the macro-collimator.

Down-beam of the collimator element array there is one or more additional electrodes such as the control lens array 250. The control lens array 250 comprises a plurality of control lenses. Each control lens comprises at least two electrodes (e.g. three electrodes) connected to respective potential sources. The control lens array 250 may comprise two or more (e.g. three) plate electrode arrays connected to respective potential sources. Any additional electrodes such as the control lens array 250 is associated with the objective lens array 241 (e.g. the two arrays are positioned close to each other and/or mechanically connected to each other and/or controlled together as a unit). The control lens array 250 is positioned up-beam of the objective lens array 241. The control lenses pre-focus the sub-beams (e.g. apply a focusing action to the sub-beams prior to the sub-beams reaching the objective lens array 241). The pre-focusing may reduce divergence of the sub-beams or increase a rate of convergence of the sub-beams.

The scan-deflector array 260 comprises a plurality of scan deflectors. The scan-deflector array 260 may be formed using MEMS manufacturing techniques. Each scan deflector scans a respective sub-beam over the sample 208. The scan-deflector array 260 may thus comprise a scan deflector for each sub-beam. Each scan deflector may deflect rays in the sub-beam in one direction (e.g. parallel to a single axis, such as an X axis) or in two directions (e.g. relative to two non-parallel axes, such as X and Y axes). The deflection is such as to cause the sub-beam to be scanned across the sample 208 in the one or two directions.

In some embodiments, the scanning deflectors described in EP2425444, which document is hereby incorporated by reference in its entirety specifically in relation to scan deflectors, may be used to implement the scan-deflector array 260. The scan-deflector array 260 is positioned between the objective lens array 241 and the control lens array 250. In the example shown, the scan-deflector array 260 is provided instead of a macro scan deflector. A scan-deflector array 260 (e.g. formed using MEMS manufacturing techniques as mentioned above) may be more spatially compact than a macro scan deflector.

In other embodiments both a macro scan deflector and the scan-deflector array 260 are provided. In such an arrangement, the scanning of the sub-beams over the sample surface may be achieved by controlling the macro scan deflector and the scan-deflector array 260 together, desirably in synchronization.

In the example of FIG. 8, a collimator element array 271 is provided instead of a macro collimator. Although not shown, it is possible to use a macro collimator in the example of FIG. 8, to provide an example having a macro-collimator and a scan deflector array 260. Another variation may have a macro-collimator and a macro-scan deflector. It is also possible to have a variation of the example of FIG. 8 with a macro scan deflector and a collimator element array. Each collimator element collimates a respective sub-beam. The collimator element array 271 (e.g. formed using MEMS manufacturing techniques) may be more spatially compact than a macro collimator. Providing the collimator element array 271 and the scan-deflector array 260 together may therefore provide space saving. In such an example there may be no macro condenser lens or a condenser lens array. In this scenario the control lens therefore provides the possibility to optimize the beam opening angle and magnification for changes in landing energy.

Figure 9A:
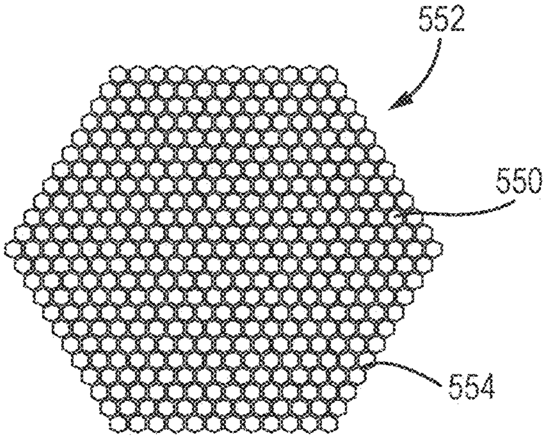
FIGS. 9A and 9B are schematic representations of a sensing detector array and an associated cell array according to some embodiments of the present disclosure, a schematic representation of a cell of the cell array, and a cell of the cell array according to some embodiments of the present disclosure.

As shown in FIG. 9A a surface of a detector array or detector module (or sensor array or sensor module), desirably facing, even proximate in use to a sample, features an array of detector elements (or an array of detectors). Each detector element is associated with an aperture. Each detector element is associated with an assigned surface area of the substrate of the detector module. As the substrate is layered, for example in having a CMOS structure, each layer within the substrate is positioned with respect to the respective detector elements, desirably proximately. Commercially available CMOS structures have a usual range of layers, for example three to ten, usually about five. (For example, two functional layers may be provided for ease of description, which may be referred to as circuitry layers. These two layers of wiring layer and logic layer may represent as many layers as required and each layer is not restricted to wiring or logic, respectively.) The number of layers is limited by commercial availability and any number of layers is feasible.

Ideally a circuit layer of the substrate, which can be the wiring layer and/or logic layer, has a portion assigned for each detector element (or detector or sensor). The assigned portions of the different layers may be referred to as a cell 550. The arrangement of portions in the substrate for the full multi-beam arrangement may be referred to as a cell array 552. The cells 550 may be same shape as the surface area assigned for each detector element, such as hexagonal, or any reasonable shape that may tesselate and may all be similar in shape and/or area, such as a rectangular shape. Having a rectangular or rectilinear shape can more readily be used by placing and routing design. Such design is commonly implemented by software that is suited to define chips with a rectangular type of architecture with orthogonal directions, than architecture requiring acute or obtuse angles such as in a hexagonal architecture. In FIG. 9A the cells 550 are depicted as being hexagonal and the cell array 552 is depicted as a hexagon comprising individual cells. However, ideally each similarly located with respect to detector elements.

Wiring routes 554 may connect to each cell 550. The wiring routes 554 may be routed between other cells of the cell array 552. Note: reference to wiring routes to be between cells of the array, it is intended that at least the wiring routes avoid the beam apertures of the array of apertures, e.g. defined through the cell array. In an arrangement circuit architecture, the cell size in at least the circuit layer may be reduced to accommodate the wiring routes, so that the wiring routes are routed between cells. Additionally or alternatively the wiring routes pass through the cells of the cell array, desirably towards the perimeter of the cells for example to reduce the interference of the wiring routes with other circuitry in the cells. Therefore reference to a wiring route between the cells encompasses: a wiring route between the circuitry of cells, a wiring route within cells, desirably towards the periphery of the cells and at least around the beam apertures through the cells and any intermediate variation. In all these arrangements, for example in a CMOS architecture, the wiring routes may be in the same die as the other circuitry which may define circuitry in the same cell as a portion of the wiring route, or circuitry in a cell around which the wiring route is routed. Thus, the cells and wiring routes may be parts of a monolithic structure. The wiring routes 554 may signally connect the cells. Thus the wiring routes signally connect the cells 550 to a controller or data processor external to the cell array or even the substrate or detector module (or sensor module). The circuit layer may comprise a datapath layer for the transmission of sensor signals from a cell outward of the cell array.

The controller or data processor may before circuitry within the substrate or detector module, desirably external to the cell array for example as control and I/O circuitry (not shown). The control and I/O circuitry may be in the same die as the cell array; the control and I/O circuitry may be monolithically integrated with the cell array, for example in the same CMOS chip. The control and to I/O circuitry enables an efficient connection between the data from all the cells of the cell array 552, even for as many cells such as around 4000 with an 8-bit digital output there would be 32,000 signals to the electronics located outside the CMOS chip. The standard way of doing this is to use a SERDES circuitry (serializer/de-serializer). Such circuitry would transform a large number of low data rate signals into a few number of high data rate signals by means of time division multiplexing. It is therefore beneficial to have control and I/O circuitry monolithically with the cell array, or at least in the detector module, than external to the detector module.

In embodiments the control and I/O circuitry may feature general supporting functions, such as circuitry to communicate with the electronics outside the CMOS chip to enable loading certain settings, for example for control of amplification and offset such as subtraction as described herein.

Figure 9B:
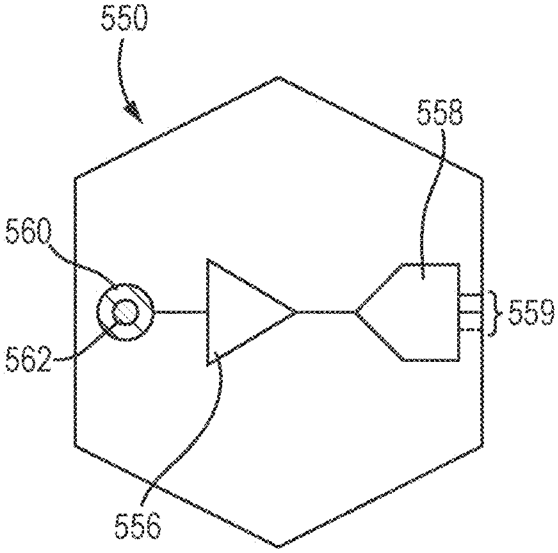

The circuit layer of a cell 550 is connected to a detector element (or sensor element) of the respective cell. The circuit layer comprises circuitry having amplification and/digitation functions, e.g. it may comprise an amplification circuit. A cell 550 may comprise a trans impedance amplifier (TIA) 556 and an analogue to digital converter (ADC) 558 as depicted in FIG. 9B. This figure schematically depicts a cell 550 with an associated detector element such as capture electrode and a feedback resistor 562 connected to the trans impedance amplifier 556 and the analogue to digital converter 558. The digital signal lines 559 from the analogue to digital converter 558 leave the cell 550. Note that the detector element is represented as a detector element 560 and feedback resistor is shown associated with the detector area as a disc 562 rather than associated with the trans impedance amplifier 556. This schematic representation is to represent each of the detector element and the feedback resistor as an area to indicate their relative size.

The trans impedance amplifier may comprise a feedback resistor Rf 562. The magnitude of the feedback resistor Rf should be optimized. The larger the value of this feedback resistor, the lower the input referred current noise. Thus the better signal-to noise ratio at the output of the transimpedance amplifier. However, the larger the resistance, Rf, the lower the bandwidth. A finite bandwidth results in a finite rise and fall time of the signal, resulting in additional image blur. An optimized Rf results in a good balance between noise level and additional image blur.

In a layered structure for chip architecture, such as CMOS, the components and features are defined as structures in a layer. The specification of a component is dependent on the material of the layer and the physical properties of the layer, the dimensions of the layer, specifically its thickness and the dimensions of the structure formed in the layer. A resistor may take the form of a long narrow path, route, or wire. In view of space constraints, the path may be non-linear, having corners along its path. For such a long component, the width of the path in the layer may vary such as through manufacturing tolerances. A corner may provide greater variance than a linear section of the path, limiting the accuracy with which the resistor can be made in order to have a specified resistance. With many corners and a long length, a resistor having such topology may made with poor reliability so that the resistances for equivalent resistors in different cells of the cell array may have a large range.

Such a resistive structure has a large surface area. Additionally or alternatively, a resistor with such a large surface area would additionally have a capacitance which is undesirable; such a capacitance is referred to as a parasitic capacitance. Parasitic capacitances may undesirably contribute to noise and blur, influencing the balance between noise, blur and bandwidth optimization which is elsewhere herein described.

The material properties of the layer can be modified chemically; however such modifications are unlikely to achieve the improvement of several orders of magnitude in size to fit into available space in the cell. Such modifications are unlikely to change the topography of the feedback resistor sufficiently so that has the required specification and can be made with the desired reliable accuracy.

Such requirements in reliability and size would enable the resistor to achieve its desired performance in terms of bandwidth, signal to noise ratio, and stability. Unfortunately these requirements cannot be met. A large feedback resistor is required for which space is unavailable in the cell.

Alternative amplification circuitry is proposed which does not require such a large feedback resistor. Examples include a trans impedance amplifier with a pseudo resistor as a feedback element and a direct analogue to digital converter, obviating the need for a transimpedance amplifier. Two examples of a direct analogue to digital converter are: using a low duty cycled switched resistor and using a reference capacitor. These examples are described in detail in, European Application No. 20217152.6 filed on 23 Dec. 2020, which is hereby incorporated by reference, particularly in relation to the use of a low duty cycled switched resistor and a reference capacitor. Optionally the analogue to digital converter 558 may be removed from the cells 550 so that a circuit wire 570 connects the trans impedance amplifier 556 in the cell 550 with the analogue to digital converter external to the cell array 552. Removal of the analogue to digital converter from the cell 550 provides more space available in the circuit layer of the cell 550 for a feedback resistor element. There is yet more space in the circuit layer of the cell 550 if the amplifier circuitry uses an alternative trans impedance amplifier circuit, for example if a trans impedance amplifier with a pseudo resistor used as a feedback element. Note these examples are exemplary. Other amplifier circuits may exist which achieve similar benefits to those described herein and which use similar circuit architecture for each cell as herein described.

Alternatively the analogue to digital converter 558 is external to the cell array 552. One consideration to decide whether or not the analogue to digital converter 558 is external to the cell array 552 is the sub-beam pitch of the multi-beam. This may determine whether or not space exists in the area per layer of a cell for the circuitry including amplification circuitry.

The circuit wire 570 connects the trans impedance amplifier in a cell 550 with the associated analogue to digital converter 558. The circuit wire 570 transmits an analogue signal. Unlike a digital signal, a data path transmitting an analogue signal is susceptible to interference. Signal interference can be from cross-talk with other circuit wires and from external fields such as generated by the sub-beams of the multi-beam and fields from nearby charged particle optical components such as the objective lens array 241.

The circuit wire 570 is routed through a wiring route 554 as depicted in FIG. 9A. The wiring route 554 is routed between cells so that the area of a cell and its layers is used for the amplification circuitry present on a cell. The wiring route 554 therefore only uses a portion of the circuit layers in which the wiring route is present, namely between adjoining cells 550 (e.g. at least around the beam apertures 504, 406 of the adjoining cells 550; through the adjoining cells 550 such as towards the periphery of the cells or between the circuitry in a layer assigned to the adjoining cells 550, or any arrangement between the stated arrangements). This routing avoids architectural interference of the amplification circuitry and the architecture of the wiring routes 554. Circuit wires are routed along the wiring routes in the cell array in an outward direction, for example in a radially outward direction. With greater proximity to a perimeter of the cell array 552, there may be more circuit wires 570 than in a portion of the wiring route 554 remote from the perimeter. The wiring route may have a plurality of circuit wires 570, which as described, is between cells of the array. Therefore a portion of the wiring route 554 may have more than one circuit wire 570. However, having circuit wires located close to each other risks crosstalk between the circuit wires and interference of the analogue signals transmitted by the circuit wires 570.

Figure 10:
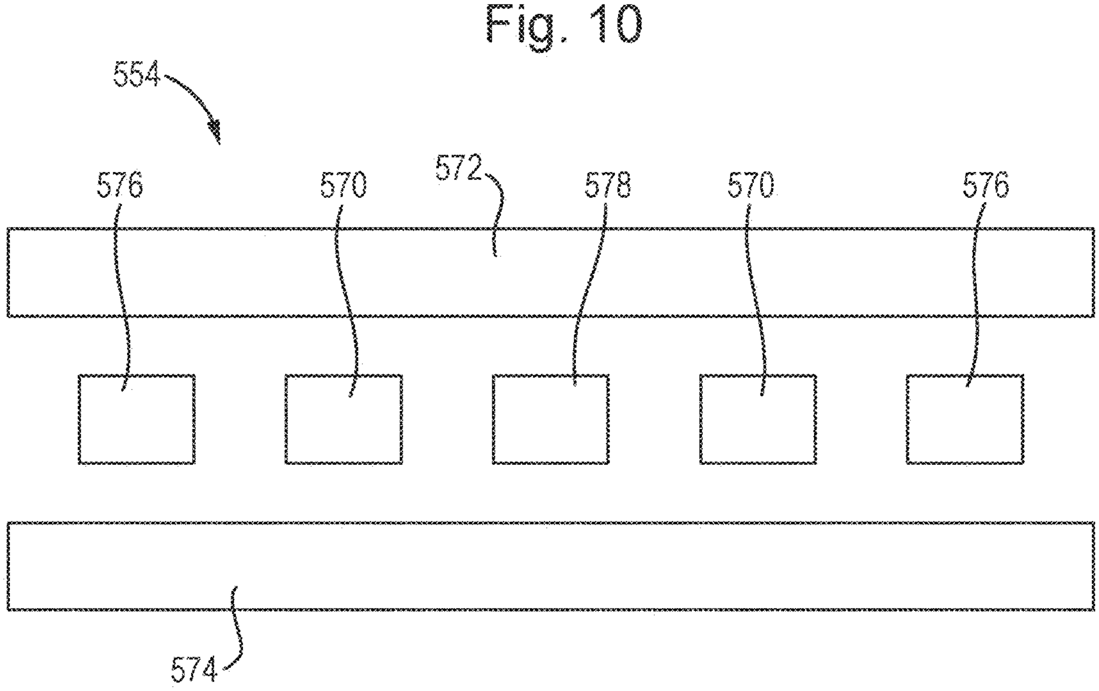
FIG. 10 is a schematic representation of a cross-section wiring route showing circuit wires and a shielding arrangement according to some embodiments of the present disclosure.

The risk of crosstalk and signal interference may be at least reduced or even prevented by having the circuit wires 570 shielded from each other within the wiring route. FIG. 10 depicts cross-section of an exemplary arrangement of wiring route 554. Within the wiring route 554 are one or more circuit wires 470, shown extending in same direction as the wiring route 554 and a shielding arrangement. The circuit wires are shown in the same layer. Above the circuit wires 570 is an upper shielding layer 572; beneath the circuit wires 570 is a lower shielding layer 574 (or more down-beam shielding layer 574). The upper and lower shielding layers of the shielding arrangement shield the circuit wires 570 from fields external to the wiring route 554 above and beneath the wiring route 554. The shielding arrangement has shielding elements in the same layer as the circuit wires 570. The shielding elements may be outer elements 576 at the outer edges of the layer comprising the circuit wires 570. The outer elements 576 shield the circuit wires 570 from fields external to the wiring route 554. The shielding elements may include intermediate shielding elements 578 that are present in the layer between adjoining circuit wires. The intermediate shielding elements 578 may therefore at least suppress if not prevent cross-talk between the circuit wires 570. In operation, a common potential is applied to the shielding layers 572, 574 and shielding elements 576, 578. The potential may be a reference potential for example a ground potential.

Although FIG. 10 depicts a three-layer arrangement, as many layers may be used in the wiring route 570 as may be desired with upper shielding layer 572, a lower shielding layer 574 and an intermediate shielding layer as required.

A further consideration of the design of wiring route is the number of circuit wires that may need to be present in an exemplary design of detector module (or sensor module), for example consider the arrangement of FIG. 10 with all circuit wires 570 in a layer.

For example, an array of sub-beams is arranged a hexagonal array with around thirty rings of sub-beams, for example arranged concentrically. The detector module therefore has a cell array of corresponding design. The number of cells is around 3000. Such a cell array may have a pitch of between 50 and 100 micron.

The outermost ring has the highest number of signals that need to be routed through the ring. Considering the wiring route is routed between cells of the cell array, all the signals of the cells are routed through the outermost ring, between the cells of the outermost ring. In this example the outermost ring consists of 180 cells, so the number of signals transported through the outermost ring, e.g. between the cells of the outermost ring, is approximately 2600=. Thus, the maximum number of signals to be routed through the outer ring between adjacent cells is the total number of signals (2600) divided by the number of cells in the outermost ring (180). This is fifteen 15 (rounded up to the nearest whole number). Since the wiring route has a shielding arrangement to ensure that the signals are well shielded, e.g. limiting crosstalk and the influence of external fields, there may be sixteen shielding elements, including fourteen (14) intermediate shielding elements and two outer shielding elements 576. Therefore between adjacent cells 550 of the outer ring of the example, a wiring route having all circuit wires in the same layer would have thirty-one (31) elements of alternate shielding elements and circuit wires.

For cell array 552 for a beam array with a pitch of between 50 and 100-microns, there is enough space, or area, available in the circuit layer, for such a wiring route 554. In a structure created using a process at the 180 nm node, the minimum half pitch of a metal layer is typically around 280 nm. In this context a half pitch is a line and a pitch is the line with an associated gap with an adjoining gap. The associated gap is typically the same width the line. The wiring route for thirty-one elements requires thirty-one pitches. However, the associated gap of one of the elements, that corresponds to the outer elements 576, is not part of the wiring route 554, but would separate the wiring route from adjoining circuitry. Therefore, for thirty-one elements, sixty-one (61) half pitches are required, which corresponds to a width of the circuit wiring 554 of approximately 17.1 micrometers.

In a different arrangement, the beam array may be hexagonal having 108 rings and around 35000 cells and may be considered to be a monolithic beam array. The outermost ring has around 650 cells. Around 34350 signals are required to be routed through the outermost ring. So around 54 signals need to be routed through adjoining cells in the outermost ring. A wiring route 554 having 54 circuit wires 570 has 55 shielding elements. In an alternative arrangement the beam arrangement is apportioned in to two or more strips with one or more intermediate strip for routing a support structure, cooling features such as conduits, data transmission lines and the like. Such a beam array may be referred to as a stripped beam array. The wiring routes may therefore be routed through the one or more intermediate strips. This enables a larger beam array, thus cell array yet maintaining a reasonably sized wiring route. If a stripped beam array were to have the same number of sub-beams as a monolithic beam array, the wiring routes would have fewer circuit wires 570 than the monolithic cell array i.e. fewer than 54. Indeed a stripped beam array may achieve a larger number of sub-beams than a monolithic beam array because the size of the beam array, as limited by the maximum number of circuit wires that may be in the wiring route, would be larger.

This functionality is beneficial with a trans impedance amplifier with a feedback element having pseudo resistor. A pseudo resistor has different effective resistances on application of different applied voltages; unlike an ideal resistor which has a single resistance at all applied potential differences. In providing different resistance, the trans impedance amplifier associated with the pseudo resistor operates as a variable amplification. In providing an amplifier with variable functionality, an optimized balance between noise levels and image blur (referred to herein above as 'additional blur') may be achieved. Beneficially, the programmable amplification circuit may match the output of the trans impedance amplifier with the input of the analogue to digital converter. These measures help to ensure that the dynamic range of the trans impedance amplifier and the analogue to digital converter, and thus desirably the amplification circuit, are optimally used for different use cases. Such different use cases may include: the material properties of a sample under inspection, different assessment tool configurations for example using different beam currents. The range of applications may be enabled by the provision of a variable amplifier and a variable off set or threshold (e.g. subtraction by a programmable offset) desirable enables tuning of amplification, threshold and bandwidth As mentioned elsewhere herein, the circuitry associated with variable amplification and subtraction may be comprised in the control and I/O circuitry.

Known apparatus for detecting signal particles emitted from a sample assume that the source provides a uniform primary beam, e.g. with a uniform current distribution. However, in practice, the primary beam is rarely perfectly uniform. For example, the source current uniformity may vary with time and use relative to a nominal value.

Embodiments of the present disclosure can be used to measure uniformity and/or other parameters of the primary beam. The measurements of the beam uniformity and/or other parameters can be used to correct and/or mitigate for deviations in the uniformity of the beam.

Figure 11:
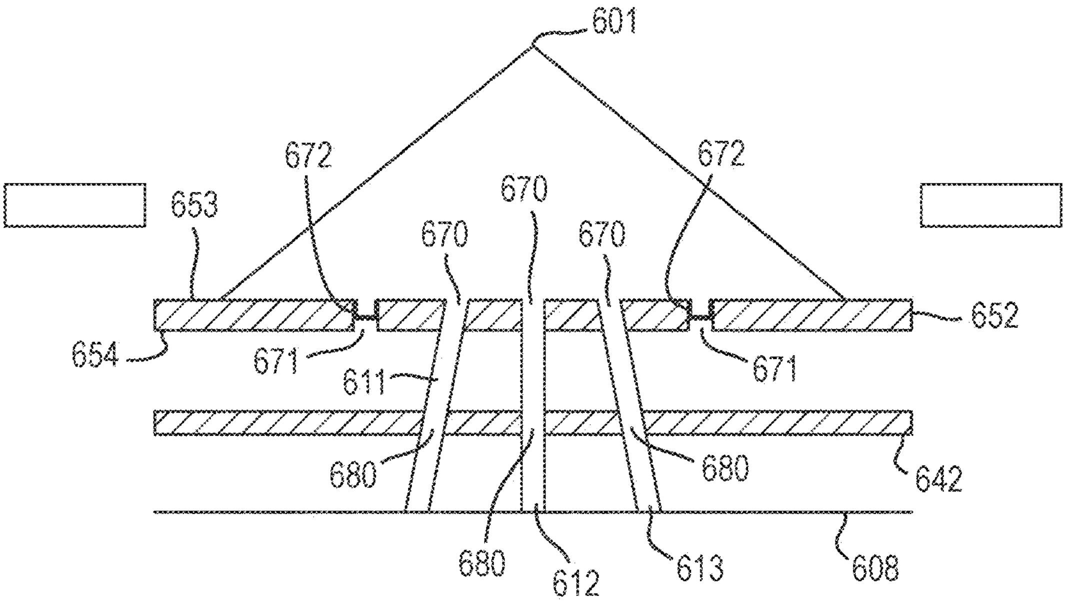
FIG. 11 is a schematic diagram of an exemplary charged particle device with a monitoring detector according to some embodiments of the present disclosure.

In some embodiments, a charged particle device, for example as depicted in FIG. 11, for a charged particle inspection apparatus is provided. Thus, the charged particle device is suitable for use in, or as part of, a charged particle inspection apparatus. The charged particle inspection device may be configured to project an array of sub-beams towards a sample. The charged particle device comprising a charged particle optical element and at least one detector (or monitoring detector). The depicted arrangement may correspond to a condenser lens array 231 as depicted and described with reference to FIG. 3. It should be further noted that the arrangement of the cell array associated with the sensing detector array described with reference to and as depicted in FIGS. 9A, 9B and/or 9B may be applied to a monitoring detector array in the present example as well as any other embodiment as described below. Features are the same unless stated to the contrary.

The charged particle optical element 652 comprises an up-beam surface 653 in which is defined a plurality of openings configured to generate an array of sub-beams 611, 612, 613 from a charged particle beam. In other words, the upper surface 653 of the charged particle optical element 652 has openings through which at least part of a primary beam may pass through to form sub-beams. As shown in FIG. 11, the charged particle optical element 652 may be a planar element, i.e. may be substantially planar or may be referred to as a plate.

In the charged particle optical element 652 are defined sub-beam apertures 670 through the charged particle element 652 for the array of sub-beams 611, 612, 613 along sub-beam paths towards a sample 608. In the charged particle optical element 652 is defined at least one monitoring aperture 671 extending through the charged particle element 652. FIG. 11 depicts two monitoring apertures 671 and multiple monitoring apertures are described herein. The sub-beam apertures 670 and the monitoring apertures 671 extend through the whole charged particle optical element 652. The sub-beam apertures 670 and the monitoring apertures 671 could otherwise be referred to as through-holes.

The detectors 672 (or monitoring detectors 672, which may be referred to as detectors for ease of reference hereinafter) are positioned in the monitoring apertures 671. Such monitoring detectors 672 are for detecting one or more sub-beams of the beam arrayment, or sub-beams derived from the same source beam from which the sub-beams of the multi-beam array are generated. The monitoring detectors are different from the sensing detector in that the monitoring detectors monitor one or more parameters of a sub-beam from the source, or a charged particles emitted from the source, whereas the sensing detector is arranged to detect signal particles from a sample. FIG. 11 depicts two detectors 672 and multiple detectors are described herein. At least one detector 672 may be positioned in each monitoring aperture 671. There may be a single detector 672 in each monitoring aperture 671, i.e. a single detector 672 positioned in a single monitoring aperture 671. At least part of each detector 672 is down-beam of the up-beam surface. Desirably the whole detector 672 is down-beam of the up-beam surface 653.

Note the monitoring detector 672 should be distinguished from the sensor module or sensing detector array 240.

The detectors 672 are configured to measure a parameter of a portion of the charged particle beam incident on the detector 672. The measured parameter can be used to determine characteristics of the beam which may provide an indication of the uniformity of the beam. The measured parameter can be compared to a predetermined value expected for the parameter or could be compared to other measurements of that parameter from other detectors. The measured parameter may be used to correct and/or mitigate deviations in the beam uniformity. The measured parameter may correspond to source beam uniformity, brightness and/or emission strength of the source beam and/or alignment between the array of sub-beams and a charged particle optical element.

When one of the detectors 672 is positioned in a respective monitoring aperture 671, the detector 672 may prevent passage of the monitoring beam through the monitoring aperture 671. Thus, the detector 672 can block the monitoring aperture. Desirably, the detector 672 is configured to occlude the monitoring aperture 671. In this case, the detector 672 may fully block seal or close up the monitoring aperture 671.

As described, the detector 672 is positioned in the monitoring aperture 671. Thus the detector 672 desirably sits within the monitoring aperture 671. For example, as shown in FIG. 11, the detector 672 can be positioned in the monitoring aperture 671 so that it is not sitting on the up-beam surface 653 of the charged particle optical element 652. The detector 672 may protrude slightly from the up-beam 653 surface of the charged particle optical element 652. However, desirably, the detector 672 is positioned so that is the detector 672 is recessed into the up-beam surface 653 of the charged particle optical element 652. Thus, the detector 672 may not protrude from the monitoring aperture 671 above the up-beam surface 653. In this case, the detector 672 may sit fully within the monitoring aperture 671 optionally so as to be flush with the up-beam surface 653, e.g. as shown in FIG. 11, or to be positioned further into the monitoring aperture 671 such that there is a gap between the top of the detector element 672 and the up-beam surface 653.

The charged particle optical element 652 comprises a down-beam surface 654 in which the plurality of openings are defined. As the sub-beam apertures 670 and the monitoring apertures 671 extend through the whole charged particle optical element 652, the plurality of openings correspond to (and are in the same position in plan) as the plurality of openings in the up-beam surface 653. The down-beam surface 654 may be recessed at the position corresponding to the monitoring aperture 671. Thus, the detector 672 may be recessed into the down-beam surface 654 such that a base of the detector element 672 is recessed into the down-beam surface 654. In other words, there may be a gap between the base of the detector element 672 and the down-beam surface 654. This may be desirable should the down-beam surface 654 be in a part of the electron optical device 240 within an electric field. Alternatively, the down-beam facing surface 654 may be substantially co-planar at the position of the detector 672. Thus, the base of the detector element 672 may be flush with the down-beam surface 654.

In an arrangement, that is the detector 672 may be recessed into the charged particle optical element with respect to the up-beam surface 653 and the down beam surface 654 of the charged particle optical element 652.

The diameter of each of the monitoring apertures 671 may be the same as the diameter of each of the sub-beam apertures 670. Desirably, the diameter of each of the monitoring apertures 671 is greater than, or substantially equal to, the diameter of each of the sub-beam apertures 670. It can be beneficial for the diameters of the monitoring apertures 671 to be the same as (i.e. substantially equal to) the diameters of the sub-beam apertures 670 for reducing end of array effects. The diameter of each of the monitoring apertures 671 could be smaller than the diameter of each of the sub-beam apertures 670 which might improve sensitivity and/or reduce or prevent scatter of charged particles.

Desirably, the monitoring apertures 671 are radially outward of the sub-beam apertures 670. Thus, all the monitoring apertures 671 are desirably closer to an edge of the charged particle optical element 652 than the sub-beam apertures 670. Providing the monitoring apertures 671 radially outward of the sub-beam apertures 670 may be particularly beneficial in reducing end of array effects, which may otherwise be known as edge array effects, desirably if the charged particle optical element 652 is subject to applied potential for example so that it is used as an electrode such as part of a lens array.

Additionally, the monitoring apertures 671 radially outward of the sub-beam apertures 670 can be used to monitor emission current uniformity and stability by monitoring the outskirt emission area (not used to generate multiple beamlets). The detectors 672 may detect a property of their respective sub-beams. The property measured is a property of the beam arrangement, which is indicative of a property of the source beam. A number of properties may be appropriate for detection. For example a change in the distribution of the charged particle emission may be detected. A change in the effective emission area over the sub-beams of the beam arrangement may be represented by changes in detected properties of sub-beams at the edge or outskirts of the beam arrangement. For example the current of the sub-beams may reduce if the effective emission area reduces. Thus a change of an outskirt emission property, for example over the beam arrangement, may indicate change of effective emission area for example of the source beam from which the sub beams of the beam arrangement are generated.

The edge array effects may be further improved by providing additional apertures through the whole of the charged particle optical element 652 (not shown in FIG. 11). The additional apertures may be provided radially outward of the sub-beam apertures 670. The additional apertures may not be used for monitoring, i.e. may not have corresponding detectors. The additional apertures may generate sub-beams which may ultimately not be projected all the way to the sample, e.g. due to some form of obstruction down-beam of the charged particle optical element, e.g. a further charged particle optical element without apertures corresponding to the additional apertures in the charged particle optical element.

Desirably, the charged particle element 652 is configured to generate the array of sub-beams from a source beam 601. The source beam may be a charged particle beam. The charged particle device may further comprise a source configured to generate the source beam from which the plurality of sub-beams are generated. The source 601 may be the same as the electron source 201 described above. Although of course any appropriate charged particle source may be used.

As shown in FIG. 11, the charged particle device may comprise at least one additional charged particle optical elements. For example, charged particle device may comprise an additional charged particle optical element 642 which is down-beam of the charged particle optical element 652. Thus, the charged particle optical element 652 may be an up-beam charged particle optical element and the device may comprise a down beam charged optical element 642. Desirably, a plurality of apertures 280 are defined in the down-beam charged particle optical element which are configured for alignment with the paths of the array of sub-beams 611, 612, 613 which may be referred to as a beam arrangement of the multi-beam. Thus, an aperture 280 may be provided in the down-beam charged particle optical element 642 for each of the sub-beams 611, 612, 613, to allow the sub-beams 611, 612, 613 to pass through the down-beam charged particle optical element 242 towards the sample. Note the down beam charged optical element 642 does not have monitoring apertures because in this example any beams that would be formed by the monitoring apertures 671 defined in the up-beam surface of the charged particle optical array are captured and detected by respective detectors 272 within the apertures. The down beam charged particle optical element 242 may be a planar element. i.e. may be substantially planar or may be referred to as a plate. Together the charged particle optical element 652 and the down beam charged optical element 642 may cooperate to provide a charged particle optical component such as lens array e.g. a condenser lens array. Although this additional charged particle optical element is depicted in FIG. 11, the charged particle device could be provided without the down-beam charged particle optical element 242.

Although FIG. 11 depicts two monitoring apertures 671 and multiple monitoring apertures are described herein, only a single monitoring aperture 671 may be provided. Alternatively, more than two monitoring apertures 671 may be provided. Any appropriate number of monitoring apertures 671 may be used. For example, the charged particle device may comprise 1, 2, 3, 4, 5, 6, 7, 8, 9, 10, 11, 12, 13, 14, 15, 16, 17, 18, 19, 20, or more monitoring apertures 671 positioned in the charged particle optical element 652. The charged particle element 652 may at least surround the apertures for paths of the charged particle beams in the charged particle optical element 652 for example one more sides of an aperture array in the charged particle optical element 652. Alternately the monitoring apertures may entirely surround the aperture arrays for the paths of the charged particle beams. In an arrangement there is a detector 672 for a group of two or more apertures for the path of a respective charged particle beam; alternatively there is a detector for each aperture for a path of a charged particle beam.

Although FIG. 11 depicts two detectors 672 and multiple detectors are described herein, only a single detector 672 may be provided. Alternatively, more than two detectors 672 may be provided. Any appropriate number of detectors 672 may be used. For example, the charged particle device may comprise 1, 2, 3, 4, 5, 6, 7, 8, 9, 10, 11, 12, 13, 14, 15, 16, 17, 18, 19, 20, or more detectors 672 positioned in the charged particle optical element 652. The charged particle element 652 may at least surround the apertures in the charged particle optical element 652 for example one more sides of an aperture array in the charged particle optical element 652 or entirely surround the aperture arrays for the paths of the charged particle beams. In an arrangement there is a detector 672 for a group of two or more apertures for the path of a respective charged particle beam; alternatively there is a detector for each aperture for a path of a charged particle beam. Additional detectors 672 may be provided and associated with other elements.

As described above, the charged particle optical element may desirably comprise multiple monitoring apertures 671 and multiple detectors 672. More particularly, the charged particle optical element 652 may comprise an array of monitoring apertures 671 and an array of detectors 672. Desirably, the number of detectors 672 positioned in the charged particle optical element 652 is the same as the number of monitoring apertures 671 included in the charged particle optical element 652. Thus, each detector 672 may be associated with a single monitoring aperture 671. (Note any monitoring aperture of the charged particle optical element 652 which does not have an associated detector 672 would allow a sub-beam to pass down beam to, for example, the additional charged particle optical element 642. A detector present in or on the additional charged particle optical element 642 may capture the beam. The detector may have all the characteristics and be accommodated into the additional charged particle optical element 642 in the same way as the detector 672 is accommodated in the monitoring apertures 671 of the charged particle optical element 652. However if should be noted that if the down surface of the additional charged particle optical element 642 is a field free environment, the monitoring apertures do not require a recess in the down beam surface of the additional charged particle optical element 642)

Figure 12:
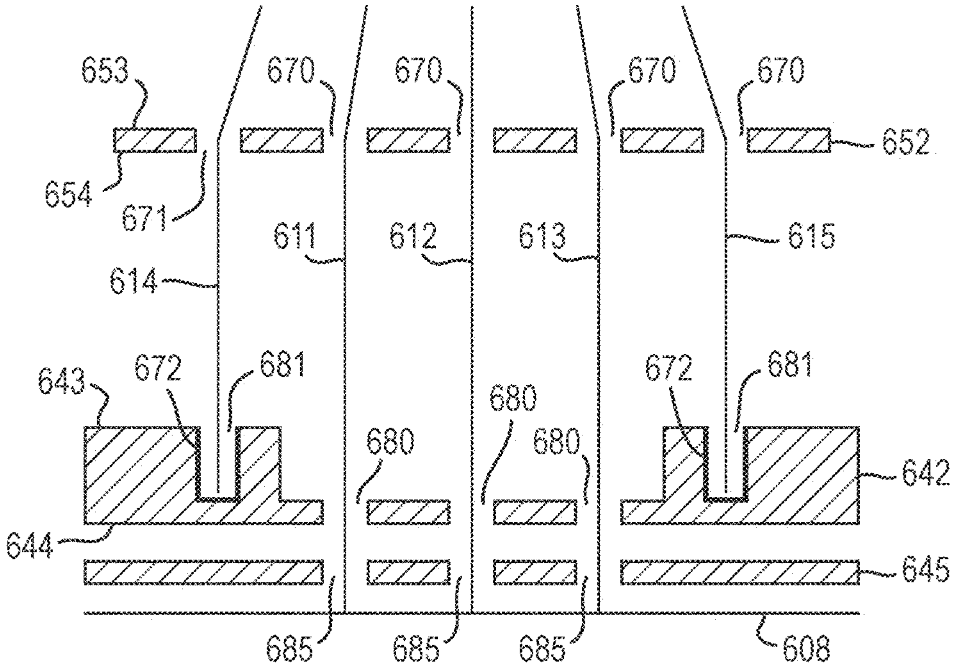
FIG. 12 is a schematic diagram of an exemplary charged particle device with a monitoring detector according to some embodiments of the present disclosure.

In some embodiments, a charged particle device, for example as depicted in FIG. 12, for a charged particle inspection apparatus is provided. Thus, the charged particle device is suitable for use in, or as part of, a charged particle inspection apparatus. The charged particle inspection device may be configured to project an array of sub-beams towards a sample. The charged particle device comprising an up-beam charged particle optical element 652, a down-beam charged particle optical element 642, and at least one detector 672.

The up-beam charged particle optical element 652 comprises a plurality of apertures 670, 671 through the up-beam charged particle element 652. The up-beam charged particle optical element 652 comprises an up-beam surface 653 in which is defined the plurality of apertures through the up-beam charged particle element 652 configured for alignment with the paths of a plurality of beams 611, 612, 613, 614, 615, i.e. representative of a beam arrangement of the multi-beam. The plurality of apertures 670, 671 may have corresponding openings in the up-beam surface 653. Thus, the upper surface 653 of the up-beam charged particle optical element 652 has openings through which at least part of a primary beam may pass through to form the beam arrangement e.g. the plurality of beams 611, 612, 613, 614, 615. As shown in FIG. 12, the up-beam charged particle optical element 652 may be a planar element, i.e. may be substantially planar or may be referred to as a plate. The openings and/or plurality of apertures may be configured to generate the plurality of beams of the beam arrangement from a charged particle beam, for example one or more plates of condenser lenses 231. Other embodiments which charged particle optical element 652 represents are described below.

The plurality of beams (or beam arrangement) comprises an array of sub-beams 611, 612, 613 and at least one monitoring beam 614, 615. Thus, the plurality of beams which pass through the up-beam charged particle optical element during use may comprise multiple sub-beams, which are ultimately projected towards the sample 608, and at least one monitoring beam 614, 615, which is used for monitoring purposes.

In the up-beam charged particle optical element 652 are defined the plurality of apertures 670, 671. The plurality of apertures 670, 671 comprises sub-beam apertures 670 through the up-beam charged particle element for the array of sub-beams 611, 612, 613 along sub-beam paths towards a position of the sample 208. The plurality of apertures comprises at least one monitoring aperture 671 extending through the charged particle element. The sub-beam apertures 670 and the monitoring apertures 671 may be similar to each other in the up-beam charged particle optical element 652, except for the location of the different types of aperture. The different types of aperture may be distinguished by the elements along the beam path through each aperture, i.e. if a sub-beam 611, 612, 613 or a monitoring beam 614, 615 is to pass through the aperture. FIG. 12 depicts two monitoring apertures 671 and multiple monitoring apertures are described herein. The sub-beam apertures 670 and the monitoring apertures 671 extend through the whole charged particle optical element 652. The sub-beam apertures 670 and the monitoring apertures 671 could otherwise be referred to as through-holes.

The down-beam charged particle optical element 642 in which are defined a plurality of apertures 680, 681 through the charged particle element. The plurality of apertures 680, 681 are configured for alignment with the openings defined in the up-beam charged particle optical element 652. Thus, each of the plurality of apertures 680, 681 may align with one of the plurality of apertures in the up-beam charged particle element.

The down-beam charged particle optical element 242 comprises an up-beam surface 643 in which is defined the plurality of apertures 680, 681 through the down-beam charged particle element configured for alignment with the paths of a plurality of beams 611, 612, 613, 614, 615 (or beam arrangement). The plurality of apertures 680, 681 may have corresponding openings in the up-beam surface 643 of the down-beam charged particle element 642. Thus, the upper surface 643 of the down-beam charged particle optical element 642 has openings through which at least some of the plurality of beams can pass through. As shown in FIG. 12, the down-beam charged particle optical element 642 may be a substantially planar element, i.e. may be substantially planar or may be referred to as a plate. Although the plate depicted has an outer region of greater thickness in the direction of the sub-beam paths than a radially inner region of the plate, in a different arrangement the plate may have substantially uniform thickness for example without a stepped thickness, for example as described below.

In the down-beam charged particle optical element 642 are defined the plurality of apertures 680, 681, desirably in the up-beam surface 643 of the down-beam charged particle optical element 642. The plurality of apertures 680, 681 comprises sub-beam apertures 680 through the down-beam charged particle element. In the down beam surface of the down-beam charged particle optical element 642 are defined apertures corresponding to apertures 680 through the down-beam charged particle optical element 642. The sub-beam apertures 680 are configured for the paths of the array of sub-beams 611, 612, 613 along sub-beam paths towards a position of the sample 608. The sub-beam apertures 680 extend through the whole charged particle optical element 642. The sub-beam apertures 680 could otherwise be referred to as through-holes. The plurality of apertures comprises at least one monitoring aperture 681. FIG. 12 depicts two monitoring apertures 681 and multiple monitoring apertures are described herein. The monitoring apertures 681 are configured for monitoring the monitoring beam 614, 615.

The sub-beam apertures 680 and the monitoring apertures 681 may be similar to each other in the down-beam charged particle optical element 642, except for the location of the different types of aperture. Alternatively, the sub-beam apertures 680 and the monitoring apertures 681 may differ from each other, for example, the sub-beam apertures 680 may provide passages through the down-beam charged particle optical element 642 and the monitoring apertures 681 may not. The different types of aperture may be distinguished by the elements along the beam path through each aperture, i.e. if a sub-beam or a monitoring beam is to pass through the aperture.

As shown in FIG. 12, the monitoring apertures 681 may be blind apertures. Thus, the monitoring apertures 681 may not extend through the whole down-beam charged particle optical element 642. Desirably, in this case, a down-beam surface 644 of the down-beam charged particle optical element 642 is substantially co-planar at the position of the monitoring aperture 681. Alternatively, although not shown in FIG. 12, the monitoring apertures may extend through the down-beam charged particle optical element 642, i.e. through the whole down-beam charged particle optical element. Thus the monitoring apertures 681 could otherwise be referred to as through-holes. It will be noted that when plural monitoring apertures are provided, they may all be blind apertures, may all extend through the down-beam charged particle optical element, or could be a mix of at least one blind aperture and at least one through-hole.

The detectors 672 are comprised within the monitoring apertures 681, i.e. positioned in the monitoring apertures 681. FIG. 12 depicts two detectors 672 and multiple detectors 672 are described herein. At least one detector 672 may be positioned in each monitoring aperture 681. There may be a single detector 672 in each monitoring aperture 681, i.e. a single detector 672 positioned in a single monitoring aperture. At least part of each detector 672 may be down-beam of the up-beam surface of the down-beam charged particle optical element 642.

The detectors 672 are configured to measure a parameter of a corresponding monitoring beam 614, 615. The measured parameter can be used to determine characteristics of the beam which may provide an indication of the uniformity of the beam. The measured parameter can be compared to a predetermined value expected for the parameter or could be compared to other measurements of that parameter from other detectors. The measured parameter may be used to correct and/or mitigate deviations in the beam uniformity. The measured parameter may correspond to source beam uniformity, brightness and/or emission strength of the source beam and/or alignment between the array of sub-beams and a charged particle optical element or between the down-beam charged particle optical element 642 and an up-beam positioned charged particle optical element such as the up-beam charged particle optical element 652. Such alignment between the down-beam charged particle optical element 642 and an up-beam positioned charged particle optical element may be determined using at least four detectors 672 positioned in different directions around the plurality of aperture 671.

The detector 672 is configured for alignment with the path of the monitoring beam 614, 615. In particular, the monitoring aperture 681 in the down-beam charged particle optical element 642 may be aligned with one of the plurality of apertures 671 in the up-beam charged particle optical element. The detector 672 is positioned in the monitoring aperture 671 and is aligned with the monitoring beam 614, 615. This means that in use, the monitoring beam 614, 615 will be incident on a detector 672 positioned in the monitoring aperture 681.

When one of the detectors 672 is positioned in a respective monitoring aperture 681, the detector 672 may prevent passage of the monitoring beam 614, 615 through the monitoring aperture 681. Thus, the detector can block the monitoring aperture. Desirably, the detector is configured to occlude the monitoring aperture. In this case, the detector may fully block seal or close up the monitoring aperture.

As described, the detector 672 is positioned in the monitoring aperture 681. Thus the detector 672 desirably sits within the monitoring aperture 681. For example, as shown in FIG. 12, the detector 672 can be positioned in the monitoring aperture 681 so that it is not sitting on the up-beam surface of the charged particle optical element. The detector 672 may protrude slightly from the up-beam surface of the charged particle optical element. However, desirably, the detector 672 is positioned so that is the detector 672 is recessed into the up-beam surface 643 of the charged particle optical element 642. Thus, the detector 672 may not protrude from the monitoring aperture 681 above the up-beam surface. In this case, the detector 672 may sit fully within the monitoring aperture 681 optionally so as to be flush with the up-beam surface, e.g. as shown in FIG. 12, or to be positioned further into the monitoring aperture such that there is a gap between the top of the detector element and the up-beam surface.

The down-beam charged particle optical element 642 comprises the down-beam surface 644 in which at least some of the plurality of openings are defined. The down-beam surface 644 will have an opening for each of the plurality of apertures 280 which extend fully through the down-beam charged particle optical element 642. The down-beam facing surface 644 may be substantially co-planar at the position of the detector. If the monitoring aperture 681 does not extend fully through the down-beam charged particle optical element 642, the monitoring aperture may not have a corresponding opening in the down-beam surface 644 of the down-beam charged particle optical element, as shown in FIG. 12. Alternatively, if the monitoring apertures 681 extend through the down-beam charged particle optical element, there may be corresponding openings in the down-beam surface 644. In this case, the base of the detector element may be flush with the down-beam surface. Alternatively, the down-beam surface 644 may be recessed at the position corresponding to the monitoring aperture. Thus, the detector may be recessed into the down-beam surface such that a base of the detector element 672 is recessed into the down-beam surface 644. In other words, there may be a gap between the base of the detector element 672 and the down-beam surface 644. The presence of a recess may be useful when a surface of the charged particle element is located in the presence of an electric field. This may be beneficial in suppressing the edge effect in having the aperture array as a finite array.

The diameter of each of the monitoring apertures 681 may be the same as the diameter of each of the sub-beam apertures 680. Desirably, the diameter of each of the monitoring apertures 681 is greater than, or substantially equal to, the diameter of each of the sub-beam apertures 680. The diameter of each of the monitoring apertures 671 could be smaller than the diameter of each of the sub-beam apertures 670 which might improve sensitivity and/or reduce or prevent scatter of charged particles.

Desirably, the monitoring apertures 681 are radially outward of the sub-beam apertures 680. Thus, all the monitoring apertures 681 are desirably closer to an edge of the down-beam charged particle optical element than the sub-beam apertures. Providing the monitoring apertures 681 radially outward of the sub-beam apertures 680 may be particularly beneficial in reducing end of array effects, which may otherwise be known as edge array effects, for example when the surface in which the apertures are formed is in the presence of an electric field. Thus detectors recessed within the apertures 681 of the upper surface of the charged particle optical element may suppress the impact of the finite array when the upper surface of the charged particle optical element is in the presence of an electric field. Having the apertures extend through a changed particle optical element ensures that that such aperture influence an electric field to which the down beam surface of the charged particle optical element may be exposed. So edge detectors and their associated apertures at the end of the array of apertures 680, 681 may be beneficial in suppressing the edge effect in having the aperture array as a finite array.

Additionally, the monitoring apertures radially outward of the sub-beam apertures can be used to monitor emission current uniformity and stability by monitoring the outskirt emission area (not used to generate multiple beamlets). The detectors 672 may detect a property of their respective sub-beams. The property measured is a property of the beam arrangement, which is indicative of a property of the source beam. A number of properties may be appropriate for detection. For example a change in the distribution of the charged particle emission may be detected. A change in the effective emission area over the sub-beams of the beam arrangement may be represented by changes in detected properties of sub-beams at the edge or outskirts of the beam arrangement. For example the current of the sub-beams may reduce if the effective emission area reduces. This a change of an emission property, for example over the beam arrangement such as of the outskirt emission property, may indicate change of effective emission area for example of the source beam from which the sub beams of the beam arrangement are generated.

The edge array effects may be further improved by providing additional apertures (not shown) through the whole of the up-beam and/or down-beam charged particle optical elements. The additional apertures may be provided radially outward of the sub-beam apertures. The additional apertures may not be used for monitoring, i.e. may not have corresponding detectors. The additional apertures may generate sub-beams which may ultimately not be projected all the way to the position of the sample, e.g. due to some form of obstruction down-beam of the charged particle optical element, e.g. a further charged particle optical element without apertures corresponding to the additional apertures in the charged particle optical element. The additional apertures may not align with any of the sub-beams.

As shown in FIG. 12, the down-beam charged particle optical element 642 may have a greater thickness in the area in which the monitoring apertures 681 are provided that the area in which the sub-beam apertures 680 are provided. This may be beneficial for keeping the down-beam charged particle optical element thinner in the sections which the sub-beams are to travel through the down-beam charged particle optical element. This may also be beneficial in providing a thicker portion for supporting the detectors 672 in the monitoring apertures. In particular, this may be beneficial for ensuring that certain types of detector fit within the charged particle optical element. However, this is not a necessity. For example, the down-beam charged particle optical element 642 could be of substantially uniform thickness, e.g. having the thinner thickness shown in FIG. 12.

Although having a greater thickness may provide the benefits described above, the greater thickness means that there will be additional aperture array edge effects for apertures near the boundary between thinner and thicker part. Such effects may be reduced by providing additional apertures through the whole of the down-beam charged particle optical element 642. Desirably, these additional apertures would be positioned between the sub-beam apertures 680 and the monitoring apertures 681. Desirably, the additional apertures would be positioned between the sub-beam apertures 680 and the thicker section. Thus, the additional apertures may desirably be positioned in the thinner section, and radially outward of the sub-beam apertures 680. The additional apertures are not for monitoring, i.e. may not have corresponding detectors, and may not align with any of the sub-beams.

The up-beam charged particle element 652 may be configured to generate the plurality of beams 611, 612, 613, 614, 615 from a source beam. Alternatively, another element closer to the source that the up-beam charged particle element may be configured to generate the plurality of beams from a source beam 611, 612, 613, 614, 615. The source beam may be a charged particle beam. The charged particle device may further comprise a source configured to generate the source beam from which the plurality of beams are generated. The source may be the same as the electron source 201 described above. Although of course any appropriate charged particle source may be used.

When another optical element up-beam of the up-beam charged particle element 652 closer to the source generates the plurality of beams (i.e. the multi-beam arrangement), the up-beam charged optical element 652 may have one of several different forms. For example the up-beam charged optical element 652 may be electrode for lensing the paths of the sub-beams. The up-beam charged optical element 652 may be a plurality of plate electrodes that provide a lens. The paths of the plurality of beams up-beam of the up beam charged optical element are depicted up-beam of the up-beam charged particle element 652 diverging. Down-beam of the down-beam charged particle element 652 the paths of the plurality of beams, and particularly the sub-beams, are depicted as substantially collimated. The up-beam charged particle element 652 may be or may comprises a collimating deflector array. An example of a plate collimator is shown in a described in US2017243717 filed on 15 Sep. 2015 the disclosure of which is hereby incorporated by reference at least with respect to the disclosure of a collimator for example as depicted in and described with reference to FIGS. 7 & 8.

As shown in FIG. 12, the charged particle device may comprise at least one additional charged particle optical element 645. For example, charged particle device may comprise a lower charged particle optical member (i.e. element) 645 which is down-beam of the down-beam charged particle optical element 642. The lower charged particle optical element 645 may thus be positioned between the down-beam charged particle optical element 642 and the sample position (i.e. where the sample 608 will be positioned in use). Desirably, the lower charged particle optical member 645 comprises apertures 685 corresponding to each sub-beam of the sub-beam array, as shown in FIG. 12. Desirably the apertures in the lower charged particle optical member 645 for the sub-beam array extend through the lower charged particle optical member. The apertures 685 defined in the lower charged particle optical member are desirably configured for alignment with the paths of the array of sub-beams. Thus, an aperture may be provided in the lower charged particle optical member for each of the sub-beams, to allow the sub-beam to pass through the lower charged particle optical member towards the source. The lower charged particle optical member 645 may be a planar element, i.e. may be substantially planar or may be referred to as a plate.

Furthermore, the lower charged particle optical element 645 may comprise additional apertures through the whole of the lower charged particle optical element 645 (not shown in FIG. 12) which may improve edge array effects, as described above for the up-beam and/or down-beam charged particle optical elements. The additional apertures may be as described above, for example, may be provided radially outward of the sub-beam apertures and/or the additional apertures may not align with any of the sub-beams.

Although this additional charged particle optical element is depicted in FIG. 12, the charged particle device could be provided without the lower charged particle optical member or with multiple lower charged particle optical members. Additionally or alternatively, the additional charged particle optical element could be an upper charged particle optical member, e.g. positioned between the up-beam charged particle optical element and the down-beam charged particle optical element, and/or positioned up-beam of the up-beam charged particle element. Such additional charged particle optical element(s) may have apertures as described for the lower charged particle optical member, i.e. for the sub-beam array, as well as apertures for the monitoring beams. In other words, any additional charged particle optical element provided up-beam of the down-beam charged particle optical element may comprise an aperture, which extends through said element, for each of the plurality of beams, such that the array of sub-beams and monitoring beams can pass through the said element.

Although FIG. 12 depicts two monitoring apertures 681 and multiple monitoring apertures are described herein, only a single monitoring aperture 681 may be provided. Alternatively, more than two monitoring apertures 681 may be provided. Any appropriate number of monitoring apertures 671 may be used. For example, the charged particle device may comprise 1, 2, 3, 4, 5, 6, 7, 8, 9, 10, 11, 12, 13, 14, 15, 16, 17, 18, 19, 20, or more monitoring apertures 681 positioned in the charged particle optical element 242. There may be a monitoring aperture for each sub-beam of the multi-beam arrangement.

Although FIG. 12 depicts two detectors 672 and multiple detectors are described herein, only a single detector 672 may be provided. Alternatively, more than two detectors 672 may be provided. Any appropriate number of detectors 672 may be used. For example, the charged particle device may comprise 1, 2, 3, 4, 5, 6, 7, 8, 9, 10, 11, 12, 13, 14, 15, 16, 17, 18, 19, 20, or more detectors 672 positioned in the charged particle optical element 652. Additional detectors 672 may be provided and associated with other elements. There may be a detector for each sub-beam of the multi-beam arrangement.

As described above, the down-beam charged particle optical element may desirably comprise multiple monitoring apertures and multiple detectors. More particularly, the charged particle optical element may comprise a plurality, e.g. an array, of monitoring apertures and an array of detectors. Thus, the plurality of beams may comprise an array of monitoring beams, and desirably the array of detectors corresponds to the monitoring beams. Desirably the array of monitoring beams are radially outward of the array of sub-beams and/or the monitoring apertures are radially outward of the sub-beam apertures. Desirably, the number of detectors 672 positioned in the charged particle optical element 642 is the same as the number of monitoring apertures 681 included in the charged particle optical element 642. Thus, each detector 672 may be associated with a single monitoring aperture 681.

Figure 13:
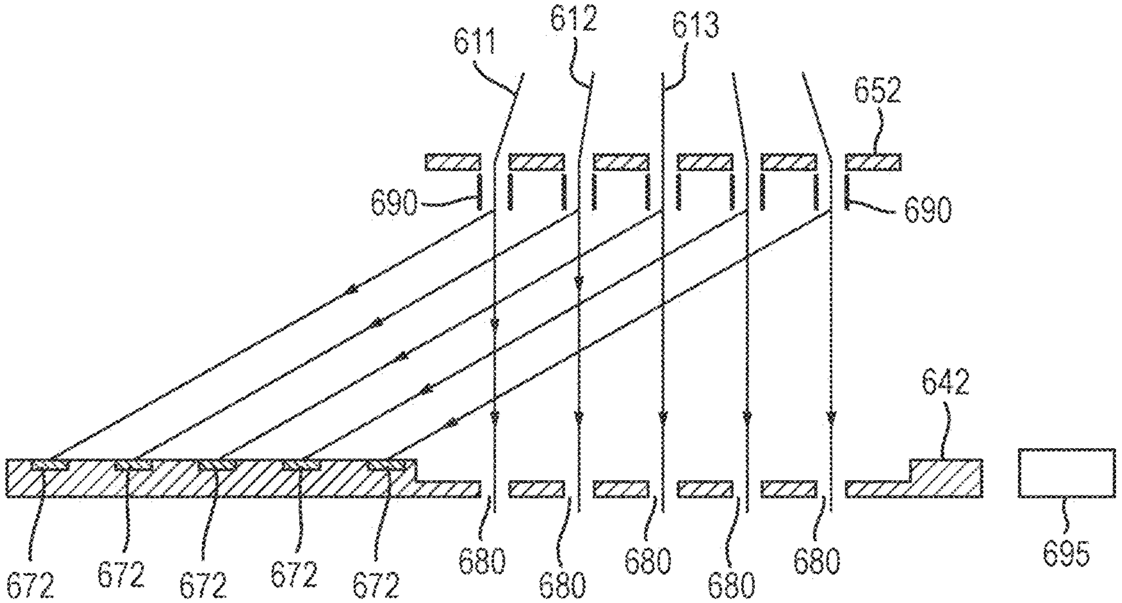
FIG. 13 is a schematic diagram of an exemplary charged particle device with a monitoring detector according to some embodiments of the present disclosure.

In some embodiments, a charged particle device, for example as depicted in FIG. 13, for a charged particle inspection apparatus is provided. The charged particle device depicted in FIG. 13 may take the same features shown in and described with reference to FIG. 12 unless stated herein explicitly to the contrary or variance. Thus, the charged particle device is suitable for use in, or as part of, a charged particle inspection apparatus. The charged particle inspection device may be configured to project an array of sub-beams towards a sample. The charged particle device comprising an up-beam charged particle optical element 652, a down-beam charged particle optical element 642, an array of detectors 272, and an actuating arrangement 690, 695. Optionally the actuating arrangement may either be or replace the charged particle optical element 652, for example as described below.

In the up-beam charged particle optical element 652 is defined sub-beam apertures therethrough. The sub-beam apertures being configured for alignment with paths of the sub-beams of the array of sub-beams towards a sample. Thus, in the up-beam charged particle optical element 652 is defined a plurality of through holes through which the sub-beams can pass. As shown in FIG. 13, the up-beam charged particle optical element may be a planar element, i.e. may be substantially planar or may be referred to as a plate.

In the down-beam charged particle optical element 642 is defined down-beam sub-beam apertures therethrough. The down-beam sub-beam apertures being configured for alignment with the paths of the sub-beams of the array of sub-beams towards the sample. Thus, in the down-beam charged particle optical element 642 is defined a plurality of through holes through which the sub-beams can pass. The down-beam charged particle optical element is down-beam of the up-beam charged particle optical element. As shown in FIG. 13, the down-beam charged particle optical element may be a planar element, i.e. may be substantially planar or may be referred to as a plate.

The array of detectors 672 are configured to measure a parameter of the sub-beams. The array of detectors may measure a parameter as described in the above embodiments. Desirably, the down-beam charged particle optical element comprises the array of detectors. The array of detectors could be positioned on an upper surface of the down-beam charged particle optical element or could be positioned in an aperture (e.g. a monitoring aperture which is a blind hole or a through hole) as described in the embodiments above.

In the present example, the array of detectors 672 are positioned radially outward of the down-beam sub-beam apertures 680. All the detectors are radially outwards of the down-beam sub-beam apertures 680 in the down-beam charged particle optical element 642. Although it is noted that additional apertures as described above (which may be beneficial in reducing edge array effects and do not align with sub-beams) may be positioned between the sub-beam apertures and the detectors 672, and/or may be positioned radially outwards of the detectors 672. Desirably, the detectors 672 are offset (or away) from the position of the down-beam sub-beam apertures 680 in the down-beam charged particle optical element 642, desirably wherein all the detectors 672 are positioned to one side of the down-beam sub-beam apertures 680 in the down-beam charged particle optical element 642 as shown in FIG. 13.

The actuating arrangement 690, 695 is configured to direct the paths of the sub-beams towards the array of detectors. Thus, in use, the actuating arrangement 690, 695 is configured to ensure that the sub-beams are incident on the array of detectors. This may be done either by deflecting (i.e. diverting) the sub-beam paths to the detectors or by moving the detectors into the sub-beam paths, as described further below.

As shown in FIG. 13, the actuating arrangement may comprise a deflector device 690 configure to deflect the paths of the sub-beams to the array of detectors. Desirably, the deflector device 690 is located along the paths of the sub-beams between the up-beam and down-beam charged particle optical element.

Figure 14A:
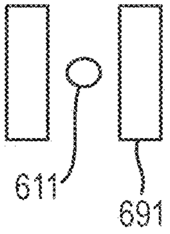
FIGS. 14A and 14B are schematic diagrams of deflectors which may be used with the charged particle device as shown in FIG. 13.
Figure 14B:
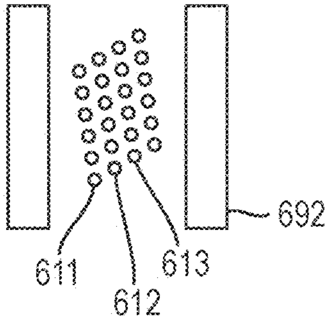

The deflector device 690 may comprise a deflector for each sub-beam to be deflected. A shown in FIG. 13, this may mean that every sub-beam has a corresponding deflector to deflect the sub-beam towards a corresponding detector 672. FIG. 14A shows how a single deflector 691 may be used on a single sub-beam 211. Additionally or alternatively, the deflector device 690 comprises a multi-beam deflector element 692, which may otherwise be referred to as a macro deflector, configured to deflect at least part of the plurality of sub-beams 611, 612, 613, and desirably, all sub-beams of the array of sub-beams simultaneously. FIG. 14B shows how a single deflector 692 may be used on multiple sub-beams. The macro deflector could be used instead of, or in addition to the single-beam deflectors 691 shown in FIG. 13. As shown in FIG. 13 up beam of the charged particle optical element 652 the sub-beams (or source beam in the case in which the sub-beams have yet to be generated) diverge. Down beam of deflector device 690 the sub-beams are collimated. The deflector device 690 may be considered to be a collimator. In an arrangement, the actuating arrangement may either be or replace the charged particle optical element 652. In such an instance the actuating arrange 652, 690 may take the form of a deflector any of the forms described in relation to FIG. 13. In such an arrangement the actuating arrangement 690 may be collimator, or when comprised in or taking the place of the charged particle optical element 652, the changed particle optical element may be considered to be a collimator. In a different arrangement the charged particle optical element 652 is a collimator and collimates the beams and the deflector may be controllable to actively actuate the sub-beams.

In this case, there may be a detector 672 corresponding to each sub-beam 611, 612, 613. Thus, for example, each of the sub-beams may be deflected and may have a corresponding detector, i.e. wherein there are the same number of detectors and sub-beams. Alternatively, only some of the sub-beams may be deflected, and there may be fewer detectors than sub-beams. In this case, the number of detectors may be the same as the number of deflected beams.

Even when the number of detectors is smaller than the number of sub-beams overall, all of the sub-beams may be measured by using the smaller number of detectors. For example, by using the detectors alternatively or sequentially for only a fraction of the beams and selecting this fraction by adjusting the deflector strengths. This helps reducing the number of read-out lines for the detectors.

Instead of deflecting (i.e. diverting) the sub-beam paths to the detectors, the actuating arrangement may work by moving the detectors into the sub-beam paths. Thus, the actuating arrangement comprises an actuator 695 configured to actuate the array of detectors and the down-beam charged particle optical element so that the detector array moves towards the paths of the sub-beams. The actuator 695 may comprise any appropriate actuation mechanism, for example, an electromotor, a piezomotor, a piston with pressurized-air, and/or a hinge mechanism with pressurized-air, etc. The actuator 695 may be configured to actuate the array of detectors, and more specifically, the down-beam charged particle optical element 642, laterally and/or rotationally. For example, the actuator 695 may be configured to actuate the down-beam charged particle optical element 642 by a small rotational displacement at a large distance from the axis of rotation, for example to replace an alternative set of apertures with a detector array. The actuator 695 may be configured to actuate the array of detectors, and more specifically, the down-beam charged particle optical element 642, as described in PCT/EP2021/072713 filed 16 Aug. 2021, which is hereby incorporated by reference, particularly in relation to FIGS. 3 to 13 which describe replacement of a set of apertures with detectors, and FIGS. 14 and 15 in which an actuator of the electrode supports the detector.

When the actuating arrangement is configured to move the detectors, the device may function in two different states. The device may function in an operational state in which the sub-beams 611, 612, 613 pass through the up-beam charged particle detector element 652 and the down-beam charged particle detector element 642 towards the sample. In this case, the sub-beam apertures of the up-beam charged particle optical element and the sub-beam apertures of the down-beam charged particle element are aligned. Thus, the sub-beams irradiate the sample, which may generate signal particles detectable by other detectors in the device or system. The device may function in another state, which could be called a monitoring state, in which parameters of the sub-beams are detected. In this case, the sub-beam apertures of up-beam charged particle detector element and the detectors are aligned. To move from the operational state and the test state, the actuator can move the down-beam charged particle element or the up-beam charged particle element. The up-beam and/or down-beam charged particle optical element may be moved in a plane substantially orthogonal to the sub-beam paths, which may also be substantially coplanar with a surface of the sample.

In this case, there may be a detector corresponding to each sub-beam. Thus, for example, each of the sub-beams may have a corresponding detector, i.e. wherein there are the same number of detectors and sub-beams. Alternatively, only some of the sub-beams may have detectors, and there may be fewer detectors than sub-beams.

When the charged particle device is in use, the array of sub-beams may be projected towards the sample. Thus, the sub-beams may pass through the sub-beam apertures of the up-beam charged particle optical element and then through the down-beam sub-beam apertures of the down-beam charged particle optical element.

Although the actuating arrangement 690, 695 may either deflect the sub-beams or actuate the detectors at any one time, the charged particle device may comprise the actuating arrangement configured to do both. Alternatively, the charged particle device could comprise the actuating arrangement comprising only at least one variation of deflector, or the actuator.

As shown in FIG. 13, the down-beam charged particle optical element 642 may have a greater thickness, for example in the beam direction, at least in the area in which the monitoring apertures are provided that the area in which the sub-beam apertures are provided. In particular, the down-beam charged particle optical element 642 may have a greater thickness around an outer portion of the down-beam charged particle optical element compared to the thickness for example in the beam direction of a more central portion of the element. This may be beneficial for keeping the down-beam charged particle optical element thinner in the sections which the sub-beams are to travel through the down-beam charged particle optical element. This may also be beneficial in providing a thicker portion for supporting the detectors in the monitoring apertures. In particular, this may be beneficial for ensuring that certain types of detector fit within the charged particle optical element. However, this is not a necessity. For example, the down-beam charged particle optical element could be of substantially uniform thickness, e.g. having the thinner thickness shown in FIG. 13.

Although having a greater thickness may provide the benefits described above, the greater thickness means that there will be additional aperture array edge effects for apertures near the boundary between thinner and thicker part. Such effects may be reduced by providing additional apertures through the whole of the down-beam charged particle optical element 642. Desirably, these additional apertures would be positioned between the sub-beam apertures 680 and the monitoring apertures 681. Desirably, the additional apertures would be positioned between the sub-beam apertures 680 and the thicker section. Thus, the additional apertures may desirably be positioned in the thinner section, and radially outward of the sub-beam apertures 680. The additional apertures are not for monitoring, i.e. may not have corresponding detectors, and may not align with any of the sub-beams.

The up-beam charged particle optical element 652 and the down-beam charged particle optical element 642 may be comprised in any appropriate electron optical components positioned along the paths of the sub-beams. The up-beam charged particle optical element and the down-beam charged particle optical element may respectively be comprised in different electron-optical components positioned apart along the paths of the sub-beams. Alternatively, the up-beam charged particle optical element and the down-beam charged particle optical element may respectively be comprised in the same electron-optical component positioned apart along the paths of the sub-beams. Desirably the up-beam charged particle optical element and/or the down-beam charged particle optical element are comprised in a lens array, desirably the elements are separated by an isolating member. Desirably, the upbeam and/or down-beam charged particle element is a lens electrode.

The up-beam charged particle element 652 may be configured to generate the array of sub-beams from a source beam. Alternatively, another element closer to the source that the up-beam charged particle element may be configured to generate the array of sub-beams from a source beam. The source beam may be a charged particle beam. The charged particle device may further comprise a source configured to generate the source beam from which the array of sub-beams are generated. The source may be the same as the electron source 201 described above. Although of course any appropriate charged particle source may be used.

Although not shown in FIG. 13, the charged particle device may comprise at least one additional charged particle optical element. For example, charged particle device may comprise a lower charged particle optical member (i.e. element) which is down-beam of the down-beam charged particle optical element. The lower charged particle optical element may thus be positioned between the down-beam charged particle optical element and the sample position (i.e. where the sample will be positioned in use). Desirably, the lower charged particle optical member comprises apertures corresponding to each sub-beam of the sub-beam array, as shown in FIG. 13. Desirably the apertures in the lower charged particle optical member for the sub-beam array extend through the lower charged particle optical member. The apertures defined in the lower charged particle optical member are desirably configured for alignment with the paths of the array of sub-beams. Thus, an aperture may be provided in the lower charged particle optical member for each of the sub-beams, to allow the sub-beam to pass through the lower charged particle optical member towards the source. The lower charged particle optical member may be a planar element, i.e. may be substantially planar or may be referred to as a plate. Additionally or alternatively, the additional charged particle optical element could be an upper charged particle optical member, e.g. positioned between the up-beam charged particle optical element and the down-beam charged particle optical element, and/or positioned up-beam of the up-beam charged particle element. Such additional charged particle optical element(s) may have apertures as described for the up-beam charged particle optical member. In other words, in any additional charged particle optical element provided up-beam of the down-beam charged particle optical element may be defined an aperture, which extends through said element, for each sub-beam of the plurality of beams, such that the array of sub-beams can pass through the said element.

Figure 15:
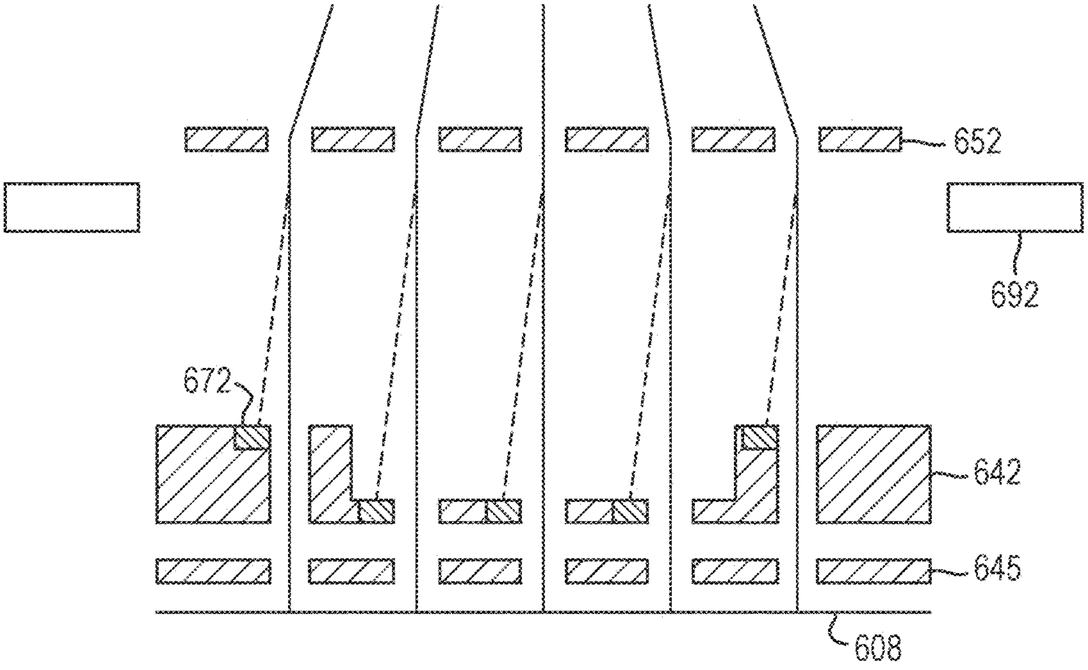
FIG. 15 is a schematic diagram of an exemplary charged particle device with a monitoring detector according to some embodiments of the present disclosure.

In some embodiments, a charged particle device, for example as depicted in FIG. 15, for a charged particle inspection apparatus is provided. Thus, the charged particle device is suitable for use in, or as part of, a charged particle inspection apparatus. The charged particle device may have the same features as shown in and described with reference to either of FIG. 12 or 13 unless stated to the contrary. The charged particle inspection device may be configured to project an array of sub-beams towards a sample for example arranged in a multi-beam arrangement. The charged particle device comprising an up-beam charged particle optical element 652, a down-beam charged particle optical element 642, an array of detectors 672, and a deflector device 692.

In the up-beam charged particle optical element is defined sub-beam apertures therethrough. The sub-beam apertures being configured for alignment with paths of the sub-beams of the array of sub-beams towards a sample. Thus, the up-beam charged particle optical element 652 comprises a plurality of through holes through which the sub-beams can pass. As shown in FIG. 15, the up-beam charged particle optical element may be a planar element, i.e. may be substantially planar or may be referred to as a plate.

In the down-beam charged particle optical element 642 is defined a plurality of sub-beam apertures therethrough. The plurality of sub-beam apertures being configured for alignment with the paths of the sub-beams of the array of sub-beams towards the sample. Thus, the down-beam charged particle optical element comprises a plurality of through holes through which the sub-beams can pass. The down-beam charged particle optical element 642 is down-beam of the up-beam charged particle optical element. As shown in FIG. 15, the down-beam charged particle optical element may be a planar element, i.e. may be substantially planar or may be referred to as a plate.

The array of detectors 672 are configured to measure a parameter of the sub-beams. The array of detectors may measure a parameter (e.g. corresponding to source beam uniformity, brightness and/or emission strength of the source beam and/or alignment between the array of sub-beams and a charged particle optical element) as described in the above embodiments. Desirably, the down-beam charged particle optical element comprises the array of detectors. The array of detectors could be positioned on an upper surface of the down-beam charged particle optical element or could be positioned in an aperture (e.g. a monitoring aperture which is a blind hole or a through hole) as described in the embodiments above. As shown in FIG. 15, some of the detectors may be positioned in blind holes and some of the detectors may be positioned in through holes.

Desirably, the detectors 672 are on the down beam charged particle optical element 642 or are down beam of an up-beam surface of the down beam charged particle optical element. The detector elements may respectively adjoin the position of a respective path of the corresponding sub-beam. The respective detector elements may adjoin the aperture in the down beam electron-optical element, of the respective sub-beam of the array of sub-beams. In other words, each detector element may be adjacent to one of the sub-beam apertures in the down-beam electrode.

In this example, the deflector device 692 is configured to deflect the paths of sub-beams to the array of detectors. Thus, the deflector device 692 may be configured in use to direct the sub-beams towards the array of detectors, rather than towards the sample. Desirably, the deflector device is located along the paths of the sub-beams between the up-beam and down-beam charged particle optical element.

Desirably, the deflector device 652 is configured to operate on all the paths of the sub-beams to deflect the paths of the sub-beams towards the detector in the same direction simultaneously. Thus, as shown in FIG. 15, all the sub-beams (or at least all the sub-beam which are to be detected) can be directed towards the array of detectors. Although this is desirable, a single sub-beam or only some of the sub-beams may be deflected towards the detectors.

The array of detectors 672 may comprise detector elements between the paths of the sub-beams. Thus, the array of detectors may be positioned between the down-beam sub-beam apertures. Each of the array of detectors may be offset from a single down-beam sub-beam aperture. Desirably each of the detectors 672 are positioned to one side of a corresponding down-beam sub-beam aperture as shown in FIG. 15.

The deflector device 692 may be a macro deflector operating on all paths of the array of sub-beams. Thus, the deflector device may comprise a multi-beam deflector element (i.e. a macro deflector), configured to deflect at least part of the plurality of sub-beams, and desirably, all sub-beams of the array of sub-beams simultaneously. A macro deflector is shown in FIG. 15, and as mentioned above, FIG. 14B shows how a single deflector may be used on multiple sub-beams.

The deflector device 692 may comprise a deflector array comprising a deflector for one or more sub-beams of the array of sub-beams. The deflector device may comprise a deflector for each sub-beam to be deflected. This may mean that every sub-beam has a corresponding deflector to deflect the sub-beam towards a corresponding detector. FIG. 14A shows how a single deflector 691 may be used on a single sub-beam. Additionally or alternatively, the single-beam deflectors could be used instead of, or in addition to, the macro deflector shown in FIG. 15.

As shown in FIG. 15 up beam of the charged particle optical element 652 the sub-beams (or source beam in the case in which the sub-beams have yet to be generated) diverge. Down beam of deflector device 690 the sub-beams are collimated. The deflector device 690 may be considered to be a collimator. In an arrangement, the actuating arrangement may either be or replace the charged particle optical element 652. In such an instance the actuating arrange 652, 690 may take the form of a deflector any of the forms described in relation to FIG. 15. In such an arrangement the actuating arrangement 690 may be collimator, or when comprised in or taking the place of the charged particle optical element 652, the charged particle optical element may be considered to be a collimator. In a different arrangement the charged particle optical element 652 is a collimator and collimates the beams and the deflector may be controllable to actively actuate the sub-beams.

The array of detectors 672 may comprise a detector element corresponding to each sub-beam of the array of sub-beams. Thus, for example, each of the sub-beams may be deflected and may have a corresponding detector, i.e. wherein there are the same number of detectors and sub-beams. Alternatively, there may be fewer detectors than sub-beams. For example, only some of the sub-beams may be deflected, and the number of detectors may be the same as the number of deflected beams. For example, there may be a single detector for two or more sub-beams, e.g. a sub-beam either side of the detector which may be deflected to said detector and the detector may measure two half fractions of the beams sequentially.

Even when the number of detectors 672 is smaller than the number of sub-beams overall, all of the sub-beams may be measured by using the smaller number of detectors. For example, by using the detectors alternatively or sequentially for only a fraction of the beams and selecting this fraction by adjusting the deflector strengths. This helps reducing the number of read-out lines for the detectors.

As shown in FIG. 15, the down-beam charged particle optical element 642 may have a greater thickness around an outer portion of the down-beam charged particle optical element compared to the thickness of a more central portion of the element. This may be beneficial for ensuring that certain types of detector positioned in the thicker portion fit within the charged particle optical element. However, this is not a necessity. For example, the down-beam charged particle optical element 642 could be of substantially uniform thickness, e.g. having the thinner thickness shown in the central portions of the down-beam charged particle optical element in FIG. 15. FIG. 15 shows some of the sub-beam apertures in the thin section and some of the sub-beam apertures in the thick section. All of the sub-beam apertures may be positioned in the thin section.

Although having a greater thickness may provide the benefits described above, the greater thickness means that there will be additional aperture array edge effects for apertures near the boundary between thinner and thicker part. Such effects may be reduced by providing additional apertures through the whole of the down-beam charged particle optical element 642. Desirably, the additional apertures would be positioned between the sub-beam apertures 680 and the thicker section. Thus, the additional apertures may desirably be positioned in the thinner section, and radially outward of at least some or the sub-beam apertures 680. The additional apertures may all be radially outwards of the sub-beam apertures 680. The additional apertures are not for monitoring, i.e. may not have corresponding detectors, and may not align with any of the sub-beams.

The up-beam charged particle optical element 652 and the down-beam charged particle optical element 642 may be comprised in any appropriate electron optical components positioned along the paths of the sub-beams. The up-beam charged particle optical element 652 and the down-beam charged particle optical element 642 may respectively be comprised in different electron-optical components positioned apart along the paths of the sub-beams. Alternatively, the up-beam charged particle optical element and the down-beam charged particle optical element may respectively be comprised in the same electron-optical component positioned apart along the paths of the sub-beams. Desirably the up-beam charged particle optical element and/or the down-beam charged particle optical element are comprised in a lens array, desirably the elements are separated by an isolating member. Desirably, the upbeam and/or down-beam charged particle element is a lens electrode.

The up-beam charged particle element 652 may be configured to generate the array of sub-beams from a source beam. Alternatively, another element closer to the source that the up-beam charged particle element may be configured to generate the array of sub-beams from a source beam. The source beam may be a charged particle beam. The charged particle device may further comprise a source configured to generate the source beam from which the array of sub-beams are generated. The source may be the same as the electron source 201 described above. Although of course any appropriate charged particle source may be used.

As shown in FIG. 15, the deflector device may be a collimator, desirably a collimator array configured to collimate the paths of the sub-beams towards the sample through the down beam charged particle optical element. If too strong a deflection is required to collimate the sub-beams, it is also possible to use weak deflection or even zero deflection in the collimator array. In this case the positions of the detectors are adjusted correspondently so that the detectors are aligned with the sub-beam paths.

Alternatively, the device may further comprise a collimator configured to collimate the paths of the sub-beams towards the sample through the down beam charged particle optical element, wherein the deflector array is located between the deflector device and the collimator. Thus, the deflector array and the collimator may be provided separately.

Alternatively, the device may further comprise a collimator configured to collimate the paths of the sub-beams towards the sample through the down beam charged particle optical element, wherein the array of detectors may be integrated into a collimator, desirably a collimator array. Thus, the deflector array and the collimator may be provided separately.

As shown in FIG. 15, the charged particle device may comprise at least one additional charged particle optical element. For example, charged particle device may comprise a lower charged particle optical member (i.e. element) 645 which is down-beam of the down-beam charged particle optical element. The lower charged particle optical element 645 may thus be positioned between the down-beam charged particle optical element and the sample position (i.e. where the sample will be positioned in use). Desirably, the lower charged particle optical member comprises apertures corresponding to each sub-beam of the sub-beam array, as shown in FIG. 15. Desirably the apertures in the lower charged particle optical member for the sub-beam array extend through the lower charged particle optical member.

The apertures defined in the lower charged particle optical member are desirably configured for alignment with the paths of the array of sub-beams. Thus, an aperture may be provided in the lower charged particle optical member for each of the sub-beams, to allow the sub-beam to pass through the lower charged particle optical member towards the source. The lower charged particle optical member 645 may be a planar element, i.e. may be substantially planar or may be referred to as a plate. Additionally or alternatively, the additional charged particle optical element could be an upper charged particle optical member, e.g. positioned between the up-beam charged particle optical element and the down-beam charged particle optical element, and/or positioned up-beam of the up-beam charged particle element. Such additional charged particle optical element(s) may have apertures as described for the up-beam charged particle optical member. In other words, any additional charged particle optical element provided up-beam of the down-beam charged particle optical element may comprise an aperture, which extends through said element, for each of the plurality of beams, such that the array of sub-beams can pass through the said element. Although the additional lower charged particle optical element 645 is shown in FIG. 15, the device of FIG. 15 could be provided without this additional element.

Figure 16:
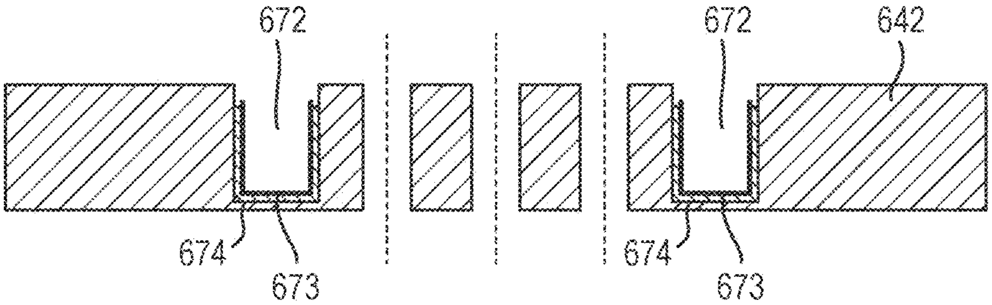
FIG. 16 is a schematic diagram showing detail of an exemplary detector suitable for use as a monitoring detector.

The detector 672 used in any of the above-described embodiments may be a charge detector. More specifically, the detector may be a Faraday cup as depicted in FIG. 16. The detector may comprise a conductive layer 674 and an insulation layer 675 surrounding the conductive layer 674. FIG. 16 shows an example of how the Faraday cup type detector can be built in to any one of the charged particle optical elements, as described above. The insulation layer 675 and a conductive layer 674 are desirably lower than a top surface (i.e. an upper surface) of the charged particle optical element (or member) as this reduces or avoids charging issue. If charging still happens in such case and influences useable sub-beams, it is also possible to locate charge detectors such as Faraday cups more remotely from the sub-beams. For example the sub-beams may be located with or in apertures in the charged particle optical element 642 away from the paths of the sub-beams of the multi-beam array for example around or at the perimeter of the apertures for the multi-beam array such as shown in and described with reference to FIG. 11 or 12. In an arrangement the charge detectors may such as Faraday cups all be set to one side of the aperture array, for example as shown in and described with reference to FIG. 13.

Desirably, diameter of the Faraday cup should be much larger than a spot size of the measured beam. Thus, the diameter of the monitoring aperture may be larger than an aperture for the sub-beams to pass through the charged particle optical element, as described above.

Desirably, Faraday cups are deep enough so that their measurement is sufficiently accurate and fewer electrons escape. The height of the Faraday cup may be approximately 10 times the diameter of the Faraday cup type detector. For this reasoning, it may be desirable to use an extra electrode below the condenser lens and/or a top electrode of the objective lens for any of the charged particle optical elements (or members) on or in which the detectors are positioned. For example only, a Faraday cup type detector element may have a diameter of approximately 10-15 μm and a depth of approximately 150 μm.

The detector 672 may comprise additional or alternative types of detector element. For example, the detector may comprise a charge detector and/or a PIN detector and/or a scintillator desirably with a corresponding directly photonically coupled photo-detector. The photo-detector may be in physical contact with the scintillator for direct optical to electrical conversation of the optical signal of the scintillator as described in EP application Ser. No. 21/183,803.2 filed on 5 Jul. 2021 which is hereby incorporated by reference at least so far as the optical connection between a scintillator and an optical to electrical converter.

The device in any of the above-described embodiments may further comprise a sensor array configured to sense signal particles emitted from the sample. The sensor array may be the same as the electron detection device 240 described above, and/or may be the same as the detector module 402 described above. The sensor array may comprise a detector element corresponding to each sub-beam of the array of sub-beams, desirably the sensor array is configured to face the sample position.

In the above embodiments, it is described that the charged particle optical elements which are down-beam comprise a sub-beam aperture for each sub-beam. However, said charged particle optical elements could instead comprise a single sub-beam aperture through which a plurality of sub-beams are projected towards the sample position. There may be multiple sub-beam apertures, but fewer than the number of sub-beams, such that multiple sub-beams pass through at least one of the sub-beam apertures.

In the above example, a detector, specifically the monitoring detector may be used to monitor one or more parameters of the incidental charged particles of, for example the primary beam. This assumes that a different detection device, e.g. a monitoring detector, is used for monitoring at least a portion of the cross-section of the source beam (or primary beam) for example as a sub-beam of the multi-beam arrangement than a detector for sensing, as a sensor, signal particles from the sample. However, the detected signal of the primary beam (or of the signal particles for that matter) may be used for monitoring the alignment, or monitoring one or more other characteristics of the charged particle beam such as brightness, emission strength and/or source beam uniformity such as its effective coverage of the multi-beam arrangement, its tilt and shift relative to an intended path of the multi-beam arrangement from the source to the sample, and the cross-sectional shape of the multi-beam arrangement. The alignment monitored may be the alignment of: the charged particle beam or charged particle beams relative to each other; of an electron optical element to the charged particle beam or charged particle beams, or an electron-optical element or as an aid to indicate the relative alignment between two electron optical elements along the beam path. The detected signal may be processed to obtain information about the charged particle beam. The information obtained about the charged particle beam or a parameter of the beam may be used by a controller to control an electron-optical element of the particle optical device 40 to adjust one more parameters of the charged particle beam.

The embodiments of the present disclosure further provide methods of using the devices described in the embodiments above. The methods may include using the device in any of the above-described embodiments with any variations described or otherwise.

In some embodiments, a method of measuring a parameter of a charged particle beam is provided. The method comprises projecting an array of sub-beams through corresponding openings defined in an up beam surface of a charged particle optical element of a charged particle device, the sub-beams comprising an array of sub-beams and a monitoring beam and the openings comprising a plurality of sub-beam apertures extending through the charged particle optical element and a monitoring aperture extending through the charged particle optical element, wherein the projecting comprising projecting the array of sub-beams along sub-beam paths towards a sample through corresponding sub-beam apertures through the charged particle optical element. The method further comprises detecting a parameter of the monitoring beam, the detecting comprising using a detector positioned in the monitoring aperture and down-beam of the up-beam surface.

Desirably, wherein the charged particle optical element is an up beam charged particle optical element and the charged particle device comprises a down beam charged particle optical element in which is defined a plurality of sub-beam apertures extending through the down-beam charged particle optical element, the method comprising projecting the array of sub-beams through the corresponding sub-beam apertures of the down beam charged particle optical element.

In some embodiments, a method of measuring a parameter of a charged particle beam is provided. The method comprises projecting a plurality of beams through corresponding apertures through an up-beam charged particle optical element of a charged particle device, the plurality of beams comprising an array of sub-beams and a monitoring beam. The projecting further comprising: projecting the array of sub-beams towards a sample through at least one sub-beam aperture defined through a down-beam charged particle optical element; and projecting the monitoring beam towards a detector. The method further comprising detecting a parameter of the monitoring beam at the detector, wherein the down-beam charged particle optical element comprises the detector.

Desirably, the detector is positioned in the down-beam charged particle optical element, desirably the detector is positioned in a monitoring aperture of the down-beam charged particle optical element, configured for alignment with the path of the monitoring beam.

In some embodiments, a method of measuring a parameter of a charged particle beam is provided. The method comprises projecting an array of sub-beams along sub-beam paths towards a sample through sub-beam apertures defined in an up-beam charged particle optical element and through sub-beam apertures defined in a down-beam charged particle optical element. The method comprises directing at least part of the array of sub-beams to an array of detectors using an actuating arrangement; and detecting a parameter of the detected sub-beams, wherein the array of detectors are positioned down beam of the actuating arrangement and radially outward of the sub-beam apertures in the down-beam charged particle optical element.

Desirably, the array of detectors is on the down-beam charged particle optical element radially outwards of the sub-beam apertures in the down-beam charged particle optical element.

In some embodiments, a method of measuring a parameter of a charged particle beam is provided. The method comprises projecting an array of sub-beams along sub-beam paths towards a sample through sub-beam apertures defined in an up-beam charged particle optical element and through sub-beam apertures defined in a down-beam charged particle optical element. The method comprises deflecting the array of sub-beams to an array of detectors. The method further comprises detecting a parameter of the detected sub-beams, wherein the array of detectors are positioned down beam of the deflecting between the sub-beam paths.

Desirably, the deflecting comprising deflecting the sub-beams towards detector elements of the array detectors positioned adjoin the respective sub-beam aperture in the down beam electron-optical element.

Any of the methods may comprising generating an array of sub-beams from at least one source beam. Desirably, the method comprising emitting at least one source beam from a respective source.

Any of the methods may comprise detecting a signal particle from the sample.

The above embodiments use methods and devices which directly measure a parameter of the primary beam which may be used as an indication of a characteristic of the primary beam, such as the uniformity of the primary beam. Alternative embodiments are described below which involve monitoring using the resist.

In some embodiments, a method of monitoring a parameter of a charged particle beam in an assessment apparatus comprising a multi-beam charged particle device is provided. For example, the method may use charged particle beams incident on the resist to measure the source current uniformity by measuring the beam intensity of individual beamlets in multi-beam SEM, the beam intensity which can be used to correct and/or mitigate deviations from the nominal values afterwards.

Figure 17:
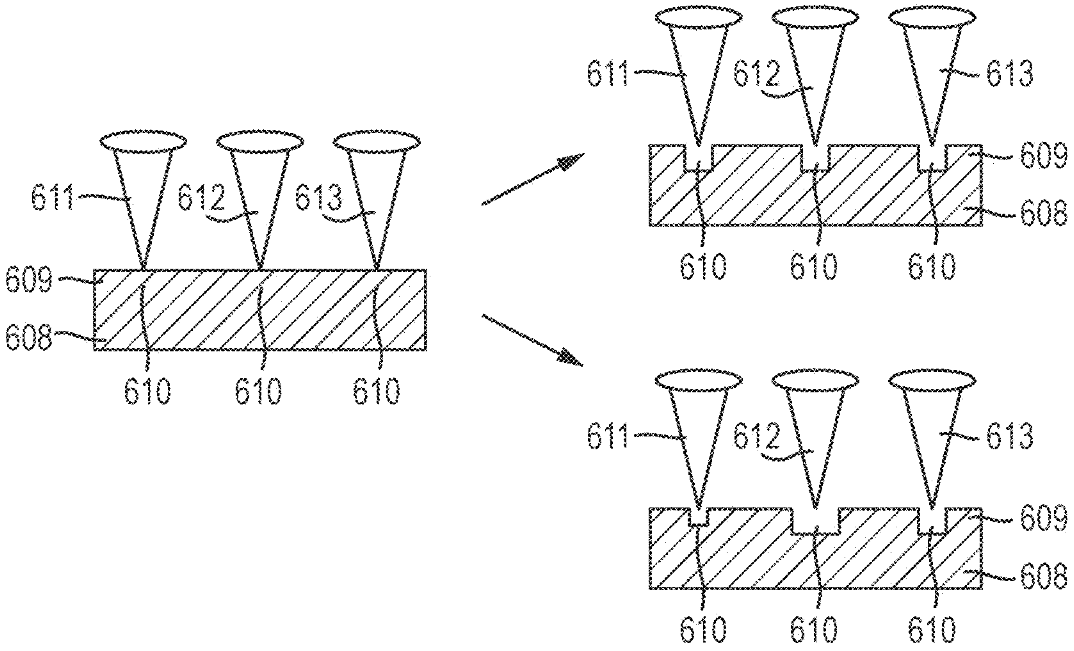
FIG. 17 shows how a parameter of a charged particle beam may be monitored according to some embodiments of the present disclosure.

Specifically, the method comprises supporting, exposing, processing, and assessing. In the supporting, a sample 608 is supported on a sample support 313, for example as shown in FIG. 17. The sample comprises a resist layer 609. The resist layer 609 faces the multi-beam charged particle device. In the exposing, the resist layer 609 is exposed with the plurality of sub-beams 611, 612, 613. In the processing, the sample 608 forms a pattern in the resist layer 609 corresponding to the exposure of the plurality of sub-beams. In the assessing, the pattern is assessed to determine a parameter of at least one of the plurality of sub-beams. Desirably, the sample comprises the resist layer.

Using this method, the source uniformity can be monitored by patterning holes into an electron-sensitive resist (e.g. Hydrogen silsesquioxane (HSQ) or Poly (methyl methacrylate) (PMMA)). (Any appropriate resist may be used to an electron beam.) The sample may be a dummy wafer coated by resist which is placed under the sub-beams. The extent to which the sample beneath the resist is exposed with depend on the patterning dose. The extent to which the sample is beneath is exposed depends linearly on the current of the sub-beams. When the sub-beam current is lower than a nominal dose, the holes 610 will be partially opened (under-exposed). When the sub-beam current is higher than the nominal dose, the holes 610 will be over-exposed and hence appear larger. When the sub-beam current is the same for all the beamlets, the holes 610 in the resist should be substantially uniform. The imaging of the patterned features can be done in the devices or apparatus described herein. The advantage of this technique is that there is no need to insert any additional optical elements inside the device and/or apparatus. However, this method needs a subsequent step before inspecting the holes, either transferring the pattern into underlying layer by etching or deposition of a metal layer on top of the exposed resist, to prevent damage by the sub-beams.

Desirably, the pattern has a feature corresponding to one or more sub-beams of the plurality of sub-beams. The assessing comprises comparing features in the pattern desirably with the representative of different sub-beams, and/or comparing a feature in the pattern with a control feature. Desirably, the feature comprises one or more characteristics. The one or more characteristics may correspond to one or more parameters of the sub-beams 611, 612, 613, respectively. The one or more characteristics may comprise one or more dimensions. The assessing may comprise measuring one or more dimensions of the one or more features, and/or the shape, and/or size of the one or more features. For example, an elliptical shape may be indicative of astigmatism, and a comet or teardrop shape may be indicative of coma. Other higher order aberrations, such as for features which are intended to have multiple sides such as a quadrilateral or hexagonal, for example, could also be detectable. Additionally or alternatively, the assessing may comprise measuring relative dimensions of different features of the pattern, for example different the different features corresponding to different sub-beams.

The method may further comprise generating the plurality of sub-beams 611, 612, 613 from at least one source beam. The plurality of sub-beams may be generated from multiple sources, e.g. by using multiple columns described further below.

The one or more parameters may comprise source beam uniformity of one or more of the sub-beams and/or the source beam and/or alignment of the sub-beams.

The generating of the plurality of sub-beams may use a beam limiting aperture array in which is defined an aperture for each of the sub-beams.

The method may further comprise emitting a source beam. Desirably wherein the emitting of the source beam using a source.

Exposing the resist layer may comprise using an assessment apparatus, such as described below and/or using the method described above. Exposing may comprise projecting a plurality of sub beams towards the resist layer.

Processing may comprise developing and/or etching the resist 609 of the sample 608.

In some embodiments, a charged particle assessment apparatus is provided for projecting a plurality of sub-beams towards a sample. The apparatus comprises a sample support, a plurality of charged particle optical elements; and a detector. The sample support is configured to support a sample. In the plurality of charged particle optical elements is defined a plurality apertures that are configured for alignment with corresponding apertures in the other charged particle optical element and paths of the plurality of sub-beams towards the sample. The detector is configured to detect signal particles from the sample in response to the plurality of sub-beams for assessment of the sample. The assessment apparatus is thus configured to expose a resist coated sample so as to monitor one or more parameters of one or more of the sub-beams.

The apparatus may further comprise a source configured to emit at least one source beam from the plurality of sub-beams are generated. The plurality of sub-beams may be generated from multiple sources, e.g. by using multiple columns described further below. Desirably the one or more parameters comprises source beam uniformity of the source and the relative alignment of the sub-beams.

The apparatus may further comprise a controller configured to control the device so as to assess the surface of the sample after exposure and after processing. The controller may be configured to receive and process a detection signal from the detector so as to assess the one or more parameters. Desirably, the processor is configured to compare detection signals representative of a feature in the surface of the sample with a control or a different feature in the surface of the sample so as to determine the one or more parameters.

Thus, the one more features of the resist may correspond to one or more characteristics of the incidental charged particle beams, such as the sub-beam of the multi-beam arrangement. The features corresponding to characteristics of the incidental charged particle beams may correspond to one or more parameters of the primary beam. That is reviewing the features in the resist enables identification of one or more parameters of the primary charged particle beam and thus information about one or more parameters about the source beam. By intermittently exposing such a resist coated sample in the charged particle apparatus, the one or more parameters of the primary beam or one or more sub-beams of the multi-beam arrangement may be monitored. The one or more parameters gathered in the monitored information may related to one or more other characteristics of the charged particle beam such as alignment, brightness, emission strength and/or source beam uniformity (such as the effective coverage of the multi-beam arrangement, the tilt and shift of the source beam relative to an intended path of the multibeam arrangement such as from the source to the sample, and the cross-sectional shape of the multi-beam arrangement) and one or more aberrations of the source beam and/or at least a sub-beam of the multi-beam arrangement such as field curvature, distortion astigmatism and coma The alignment monitored may be the alignment of: the charged particle beam or charged particle beams relative to each other; of an electron optical element to the charged particle beam or charged particle beams, or an electron-optical element or as an aid to indicate the relative alignment between two electron optical elements along the beam path, The information obtained about the charged particle beam or a parameter of the beam may be used by a controller to control an electron-optical element of the particle optical device 40 to adjust one more parameters of the charged particle beam.

An assessment tool according to some embodiments of the present disclosure may be a tool which makes a qualitative assessment of a sample (e.g. pass/fail), one which makes a quantitative measurement (e.g. the size of a feature) of a sample or one which generates an image of map of a sample. Thus, the assessment tool could be any appropriate device, apparatus or system used for assessment. For example, the assessment tool could be any of the charged particle-optical device, e.g. as part of charged particle beam apparatus 100, or more specifically the charged particle-optical device 40 (which may be a charged particle-optical column), and/or as part of an optical lens array assembly, when used for assessment. Examples of assessment tools are inspection tools (e.g. for identifying defects), review tools (e.g. for classifying defects) and metrology tools, or tools capable of performing any combination of assessment functionalities associated with inspection tools, review tools, or metrology tools (e.g. metro-inspection tools). The charged particle beam tool 40 (which may be a charged particle-optical column) may be a component of an assessment tool; such as an inspection tool or a metro-inspection tool, or part of an e-beam lithography tool. Any reference to a tool herein is intended to encompass a device, apparatus or system, the tool comprising various components which may or may not be collocated, and which may even be located in separate rooms, especially for example for data processing elements.

In any of the above embodiments, the device or apparatus may further comprise a source configured to emit at least one source beam from which the plurality of sub-beams are generated. The plurality of sub-beams may be generated from multiple sources, e.g. by using multiple columns. Desirably the one or more parameters comprises source beam uniformity of the source and the relative alignment of the sub-beams.

The embodiments of the present disclosure can be applied to various different tool architectures. For example, the charged particle beam apparatus 40 may be a single beam tool or may comprise a plurality of single beam columns or may comprise a plurality of columns of multi-beams (i.e. sub-beams). The columns may comprise the charged particle optical device described in any of the above embodiments or aspects. As a plurality of columns (or a multi-column tool), the devices may be arranged in an array which may number two to one hundred columns or more. The charged particle device may take the form of an example as described with respect to and depicted in FIG. 3 or as described with respect to and depicted in FIG. 8, although desirably having an electrostatic scan deflector array and/or an electrostatic collimator array for example in the objective lens array assembly. The charged particle optical device may be a charged particle optical column. A charged particle column may optionally comprise a source.

A multi-beam electron beam tool may comprise a gun aperture plate or Coulomb aperture array (not shown). The gun aperture plate is a plate in which apertures are defined. It is located in an electron-optical device downbeam of the source and before any other electron-optical device. In FIG. 3 it would be located between the source 201 and the condenser lens array 231. The gun aperture plate, in operation, is configured to block off peripheral electrons of primary electron beam 202 to reduce Coulomb effects in the beam before the beam separator, for example in or associated with the condenser lens array. However, the gun aperture array may have fewer apertures than the condenser lens array and a number of apertures fewer than the number of beamlets that are down beam in the multi-beam. As a gun aperture array is a type of aperture array and is spaced apart from other beam limiting aperture arrays, such as the condenser lens array and the objective lens array, it may be considered in the alignment procedure too.

The terms "sub-beam" and "beamlet" are used interchangeably herein and are both understood to encompass any radiation beam derived from a parent radiation beam by dividing or splitting the parent radiation beam. The term "manipulator" is used to encompass any element which affects the path of a sub-beam or beamlet, such as a lens or deflector.

References to up and low, upper and lower, lowest, up and down, above and below should be understood as referring to directions parallel to the (typically but not always vertical) upbeam and downbeam directions of the electron beam or multi-beam impinging on the sample 208. Thus, references to upbeam and downbeam are intended to refer to directions in respect of the beam path independently of any present gravitational field.

References to elements being aligned along a beam path or sub-beam path are understood to mean that the respective elements are positioned along the beam path or sub-beam path. A path is the location intended for a beam, such that the path can include the location of the beam when the apparatus device or system is non-operational. The path may therefore include representation of the location of the beam with respect to the components, elements and features without the beam being present. The apparatus, device or system may be designed to have the path so that in operation a beam be found at the path; that is one more charged particle may form beam at the location of the path during operation. The path may therefore be indicative of the geometrical and structural relationship of different elements, features, and components. Different elements, features and components may have different relative positions along the path intended for a beam of charged particles i.e. during operation.

Reference to a component or system of components or elements being controllable to manipulate or operate on a charged particle beam in a certain manner includes configuring a controller or control system or control unit to control the component to manipulate the charged particle beam in the manner described, as well as optionally using other controllers or devices (e.g. voltage supplies and/or current supplies) to control the component to manipulate the charged particle beam in this manner. For example, a voltage supply may be electrically connected to one or more components to apply potentials to the components, such as in a non-limited list including the control lens array 250, the objective lens array 234, the condenser lens 231, correctors, and scan deflector array 260, under the control of the controller or control system or control unit. An actuatable component, such as a stage, may be controllable to actuate and thus move relative to another components such as the beam path using one or more controllers, control systems, or control units to control the actuation of the component.

A computer program may comprise instructions to instruct the controller 50 to perform the following steps. The controller 50 controls the charged particle beam apparatus to project a charged particle beam towards the sample 208. In some embodiments, the controller 50 controls at least one charged particle-optical element (e.g. an array of multiple deflectors or scan deflectors 260) to operate on the charged particle beam in the charged particle beam path. Additionally or alternatively, in some embodiments, the controller 50 controls at least one charged particle-optical element (e.g. the detector 240) to operate on the charged particle beam emitted from the sample 208 in response to the charged particle beam.

Any element or collection of elements may be replaceable or field replaceable within the electron optical apparatus 40. The one or more charged particle-optical components in the electron optical apparatus 40, especially those that operate on sub-beams or generate sub-beams, such as aperture arrays and manipulator arrays may comprise one or more MEMS elements for example a MEMS stack.

While the present disclosure has described various embodiments, other embodiments will be apparent to those skilled in the art from consideration of the specification and practice of the technology disclosed herein. It is intended that the specification and examples be considered as exemplary only, with a true scope and spirit of the invention being indicated by the following claims and clauses.

Exemplary embodiments of the invention are described below in the following clauses:

Clause 1. A charged particle device for a charged particle inspection apparatus for projecting an array of sub-beams towards a sample, the charged particle device comprising: a charged particle optical element comprising an up beam surface in which is defined a plurality of openings configured to generate an array of sub-beams from a charged particle beam, in the charged particle optical element are defined: sub-beam apertures through the charged particle element for the array of sub-beams along sub-beam paths towards a sample; and a monitoring aperture extending through the charged particle element; and a detector positioned in the monitoring aperture and at least part of which is down-beam of the up beam surface, wherein the detector is configured to measure a parameter of a portion of the charged particle beam incident on the detector.

Clause 2. The charged particle device of clause 1, wherein the detector is configured to prevent passage of the monitoring beam through the monitoring aperture.

Clause 3. The charged particle device of clause 1 or 2, wherein the detector is configured to occlude the monitoring aperture.

Clause 4. The charged particle device of any preceding clause, wherein the detector is recessed into the up-beam surface of the charged particle optical element.

Clause 5. The charged particle device of any preceding clause, wherein the charged particle optical element comprises a downbeam surface in which the plurality of openings are defined, wherein the downbeam surface is recessed at the position corresponding to the monitoring aperture, or the downbeam facing surface is substantially co-planar at the position of the detector.

Clause 6. The charged particle device of any preceding clause, wherein the charged particle optical element is an upbeam charged particle optical element and the device further comprises a down beam charged optical element in which is defined a plurality of apertures configured for alignment with the paths of the array of sub-beams.

Clause 7. The charged particle device of any preceding clauses, wherein the charged particle optical element comprises an array of monitoring apertures and an array of detectors, desirably wherein a single detector is positioned in a single monitoring aperture.

Clause 8. A charged particle device for a charged particle inspection apparatus for projecting an array of sub-beams towards a sample, the charged particle device comprising: an up-beam charged particle optical element comprising an up-beam surface in which is defined a plurality of apertures through the charged particle element configured for alignment with the paths of a plurality of beams, the plurality of beams comprising an array of sub-beams and a monitoring beam; and a down-beam charged particle optical element in which are defined a plurality of apertures configured for alignment with the openings defined in the up-beam charged particle optical element, the apertures comprising: at least one sub-beam aperture through the charged particle element and configured for the paths of the array of sub-beams towards a position of the sample; and a monitoring aperture configured for monitoring the monitoring beam; and a detector comprised within the monitoring aperture and configured to measure a parameter of the corresponding monitoring beam.

Clause 9. The charged particle device of clause 8, wherein the detector is configured for alignment with the path of the monitoring beam.

Clause 10. The charged particle device of clause 8 or 9, wherein the monitoring aperture is blind, desirably such that a down beam surface of the down beam charged particle device is substantially co-planar at the position of the monitoring aperture.

Clause 11. The charged particle device of any of clauses 8 to 10, wherein the monitoring aperture extends through the down-beam charged particle optical element, desirably such that a down beam surface of the down beam charged particle device is recessed at the position of the monitoring aperture, desirably the monitoring aperture is occluded by the detector.

Clause 12. The charged particle device of any one of clauses 8 to 11, further comprising an upper charged particle optical member positioned between up-beam charged particle optical element and the down-beam charged particle optical element, the charged particle optical member comprising an aperture for each of the plurality of beams.

Clause 13. The charged particle device of any one of clauses 8 to 12, further comprising a lower charged particle optical member positioned between down-beam charged particle optical element and the sample position, the lower charged particle optical member comprising an aperture corresponding to each sub-beam of the sub-beam array.

Clause 14. The charged particle device of any one of the clauses 8 to 13, wherein the plurality of beams comprise an array of monitoring beams and in the down-beam aperture array is defined a plurality of the monitoring apertures, the device further comprising an array of the detectors corresponding to the monitoring beams, desirably wherein the array of monitoring beams are radially outward of the array of sub-beams and/or the monitoring apertures are radially outward of the sub-beam apertures.

Clause 15. The charged particle device of any one of the preceding clauses, wherein the monitoring aperture is radially outward of the sub-beam apertures.

Clause 16. The charged particle device of any of the preceding clauses, wherein the diameter of the monitoring aperture is greater than, or substantially equal to, the diameter of the sub-beam apertures.

Clause 17. A charged particle device for a charged particle inspection apparatus configured to project an array of sub-beams towards a sample, the charged particle device comprising:

an up-beam charged particle optical element in which is defined sub-beam apertures therethrough configured for alignment with paths of the sub-beams of the array of sub-beams towards a sample; a down-beam charged particle optical element in which is defined down-beam sub-beam apertures therethrough, the plurality of apertures configured for alignment with the paths of the sub-beams of the array of sub-beams towards the sample; and an array of detectors configured to measure a parameter of the sub-beams; and an actuating arrangement configured to direct the paths of the sub-beams towards the array of detectors, wherein the array of detectors are positioned radially outward of the down-beam sub-beam apertures.

Clause 18. The charged particle device of clause 17, wherein the actuating arrangement comprises a deflector device configured to deflect the paths of sub-beams to the array of detectors.

Clause 19. The charged particle device of clause 17 or 18, wherein the actuating arrangement comprises an actuator configured to actuate the array of detectors and the down-beam charged particle optical element so that the detector array moves towards the paths of the sub-beams.

Clause 20. The charged particle device any one of clauses 17 to 19, comprising a detector corresponding to each sub-beam.

Clause 21. The charged particle device of any one of clauses 17 to 20, wherein the deflector device comprises a deflector for each sub-beam.

Clause 22. The charged particle device of any one of clauses 17 to 21, wherein the deflector device comprises a multi-beam deflector element configured to deflect at least part of the plurality of sub-beams, desirably all sub-beams of the array of sub-beams.

Clause 23. A charged particle device for a charged particle inspection apparatus configured to project an array of sub-beams towards a sample, the charged particle device comprising: an up-beam charged particle optical element comprising in which is defined sub-beam apertures therethrough that are configured for alignment with paths of the sub-beams of the array of sub-beams towards a sample; a down-beam charged particle optical element in which is defined a plurality of sub-beam apertures therethrough, the apertures configured for alignment with the sub-beam paths of the array of sub-beams towards the sample; and an array of detectors configured to measure a parameter of the sub-beams; and a deflector device configured to deflect the paths of sub-beams to the array of detectors, a) wherein the array of detectors comprises detector elements between the paths of the sub-beams and the deflector device is configured to operate on all the paths of the sub-beams to deflect the paths of the sub-beams towards the detector in the same direction simultaneously; or b) further comprising a collimator configured to collimate the paths of the sub-beams towards the sample through the down beam charged particle optical element, wherein the deflector array is located between the deflector device and the collimator; or c) wherein the array of detectors are integrated into a collimator desirably a collimator array; or d) wherein the deflector device is a collimator, desirably a collimator array configured to collimate the paths of the sub-beams towards the sample through the down beam charged particle optical element.

Clause 24. The charged particle device of clause 23, wherein the array of detectors comprises a detector element corresponding to each sub-beam of the array of sub-beams.

Clause 25. The charged particle device of clause 24, wherein the detector elements are on the down beam charged particle optical element or are down beam of an up-beam surface of the down beam charged particle optical element.

Clause 26. The charged particle device of any of clauses 23 to 25, wherein the detector elements respectively adjoin the position of a respective path of the corresponding sub-beam.

Clause 27. The charged particle device of any of clauses 23 to 26, wherein the respective detector elements adjoin the aperture in the down beam electron-optical element, of the respective sub-beam of the array of sub-beams.

Clause 28. The charged particle device of any of clauses 23 to 27, wherein the deflector device is a macro deflector operating on all paths of the array of sub-beams.

Clause 29. The charged particle device of any of clauses 23 to 28, wherein the deflector device comprises a deflector array comprising a deflector for one or more sub-beams of the array of sub-beams.

Clause 30. The charged particle device of any of clauses 16 to 29, wherein the down beam charged particle optical element comprises the array of detectors.

Clause 31. The charged particle device of any of clauses 16 to 30, wherein the deflector device is located along the paths of the sub-beams between the up beam and down beam charged particle optical element.

Clause 32. The charged particle device of any of clauses 16 to 31, wherein the up-beam charged particle optical element and the down-beam charged particle optical element are comprised in a lens array, desirably the elements are separated by an isolating member.

Clause 33. The charged particle device of any of clauses 16 to 32, wherein the up-beam charged particle optical element and the down-beam charged particle optical element are respectively comprised in different electron-optical components positioned apart along the paths of the sub-beams.

Clause 34. The charged particle device of any of clauses 16 to 33, wherein the upbeam and/or down-beam charged particle element is a lens electrode.

Clause 35. The charged particle device of any of clauses 8 to 34, wherein the upper charged particle element is configured to generate the array of sub-beams from a source beam, desirably the source beam is the charged particle beam.

Clause 36. The charged particle device of any of clauses 1 to 7, wherein the charged particle element is configured to generate the array of sub-beams from a source beam, desirably the source beam is the charged particle beam.

Clause 37. The charged particle device of clause 35 or 36, further comprising a source configured to generate the source beam from which the plurality of sub-beams are generated.

Clause 38. The charged particle device of any preceding clause, wherein the parameter corresponds to source beam uniformity, brightness and/or emission strength of the source beam and/or alignment between the array of sub-beams and a charged particle optical element.

Clause 39. The charged particle device of any proceeding clause, wherein or both charged particle optical elements comprises a planar element.

Clause 40. The charged particle device of any of the preceding clauses, wherein the detector is a charge detector.

Clause 41. The charged particle device of any one of the preceding clauses, wherein the detector is a faraday cup, desirably wherein the detector comprises a conductive layer and an insulation layer surrounding the conductive layer.

Clause 42. The charged particle device of any preceding clause, further comprising a sensor array configured to sense signal particles emitted from the sample.

Clause 43. The charged particle device of clause 42, wherein the sensor array comprises a detector element corresponding to each sub-beam of the array of sub-beams, desirably the sensor array is configured to face the sample position.

Clause 44. A method of measuring a parameter of a charged particle beam, the method comprising: projecting an array of sub-beams through corresponding openings defined in an up beam surface of a charged particle optical element of a charged particle device, the sub-beams comprising an array of sub-beams and a monitoring beam and the openings comprising a plurality of sub-beam apertures extending through the charged particle optical element and a monitoring aperture extending through the charged particle optical element, wherein the projecting comprising projecting the array of sub-beams along sub-beam paths towards a sample through corresponding sub-beam apertures through the charged particle optical element; and detecting a parameter of the monitoring beam, the detecting comprising using a detector positioned in the monitoring aperture and down-beam of the up beam surface.

Clause 45. The method of clause 44, wherein the charged particle optical element is an up beam charged particle optical element and the charged particle device comprises a down beam charged particle optical element in which is defined a plurality of sub-beam apertures extending through the down-beam charged particle optical element, the method comprising projecting the array of sub-beams through the corresponding sub-beam apertures of the down beam charged particle optical element.

Clause 46. A method of measuring a parameter of a charged particle beam, the method comprising: projecting a plurality of beams through corresponding apertures through an up-beam charged particle optical element of a charged particle device, the plurality of beams comprising an array of sub-beams and a monitoring beam, the projecting further comprising: projecting the array of sub-beams towards a sample through at least one sub-beam aperture defined through a down-beam charged particle optical element; and projecting the monitoring beam towards a detector; and detecting a parameter of the monitoring beam at the detector, wherein the down-beam charged particle optical element comprises the detector.

Clause 47. The method of clause 46, wherein the detector is positioned in the down-beam charged particle optical element, desirably the detector is positioned in a monitoring aperture of the down-beam charged particle optical element, configured for alignment with the path of the monitoring beam.

Clause 48. A method of measuring a parameter of a charged particle beam, the method comprising: projecting an array of sub-beams along sub-beam paths towards a sample through sub-beam apertures defined in an up-beam charged particle optical element and through sub-beam apertures defined in a down-beam charged particle optical element; directing at least part of the array of sub-beams to an array of detectors using an actuating arrangement; and detecting a parameter of the detected sub-beams, wherein the array of detectors are positioned down beam of the actuating arrangement and radially outward of the sub-beam apertures in the down-beam charged particle optical element.

Clause 49. The method of clause 48, wherein the array of detectors is on the down-beam charged particle optical element radially outward of the sub-beam apertures in the down-beam charged particle optical element.

Clause 50. A method of measuring a parameter of a charged particle beam, the method comprising: projecting an array of sub-beams along sub-beam paths towards a sample through sub-beam apertures defined in an up-beam charged particle optical element and through sub-beam apertures defined in a down-beam charged particle optical element; deflecting the array of sub-beams to an array of detectors; and detecting a parameter of the detected sub-beams, wherein the array of detectors are positioned down beam of the deflecting between the sub-beam paths.

Clause 51. The method of clause 49, the deflecting comprising deflecting the sub-beams towards detector elements of the array detectors positioned adjoin the respective sub-beam aperture in the down beam electron-optical element.

Clause 52. The method of any of clauses 44 to 50, comprising generating an array of sub-beams from at least one source beam.

Clause 53. The method of clause 52 comprising emitting at least one source beam from a respective source.

Clause 54. The method of any of clauses 44 to 53 comprising detecting a signal particle from the sample.

Clause 55. A method of monitoring a parameter of a charged particle beam in an assessment apparatus comprising a multi-beam charged particle device, the method comprising: -supporting a sample on a sample support, the sample comprising resist layer, the resist layer facing the multi-beam charged particle device; -exposing the resist layer with the plurality of sub-beams; -processing the sample forming a pattern in the resist layer corresponding to the exposure of the plurality of sub-beams; and -assessing the pattern to determine a parameter of at least one of the plurality of sub-beams.

Clause 56. The method of clause 55, wherein the pattern has a feature corresponding to one or more sub-beams of the plurality of sub-beams and the assessing comprising comparing features in the pattern, desirably representative of different sub-beams, and/or comparing a feature in the pattern with a control feature.

Clause 57. The method of clause 56 the feature comprising one or more characteristics.

Clause 58. The method of clause 57, wherein the one or more characteristics corresponding to one or more parameters of the sub-beams, respectively.

Clause 59. The method of clause 58, wherein the one or more characteristics comprises one or more dimensions.

Clause 60. The method of any of clauses 56 to 58, wherein the assessing comprising measuring: one or more dimensions of the one or more features; and/or the shape and/or size of the one or more features.

Clause 61. The method of any of clauses 55 to 60, wherein the assessing comprising measuring relative dimensions of different features of the pattern, for example different the different features corresponding to different sub-beams.

Clause 62. The method of any of clauses 55 to 61, further comprising generating the plurality of sub-beams from at least one source beam.

Clause 63. The method of any of clauses 55 to 62, wherein the one or more parameters comprising source beam uniformity of one or more of the sub-beams and/or the source beam and/or alignment of the sub-beams.

Clause 64. The method of clauses 55 to 63, wherein the generating of the plurality of sub-beams using a beam limiting aperture array in which is defined an aperture for each of the sub-beams.

Clause 65. The method of any of clauses 55 to 64, further comprising emitting a source beam.

Clause 66. The method of any of clauses 55 to 65, wherein the emitting of the source beam using a source.

Clause 67. The method of any of clauses 55 to 66, wherein exposing the resist layer comprising using an assessment apparatus.

Clause 68. The method of any of clauses 55 to 67, wherein exposing comprising projecting a plurality of sub beams towards the resist layer.

Clause 69. The method of any of clauses 55 to 68, wherein processing comprising developing and/or etching the resist of the sample.

Clause 70. The method of any of clauses 55 to 69, wherein the sample comprises the resist layer.

Clause 71. A charged particle assessment apparatus for projecting a plurality of sub-beams towards a sample, the apparatus comprising: -a sample support configured to support a sample; a plurality of charged particle optical elements in which are defined a plurality apertures that are configured for alignment with corresponding apertures in the other charged particle optical element and paths of the plurality of sub-beams towards the sample; a detector configured to detect signal particles from the sample in response to the plurality of sub-beams for assessment of the sample, wherein the assessment apparatus is configured to expose a resist coated sample so as to monitor one or more parameters of one or more of the sub-beams.

Clause 72. The charged particle assessment apparatus of clause 71, further comprising a source configured to emit at least one source beam from the plurality of sub-beams are generated, Clause 73. The charged particle assessment apparatus of clause 72, wherein the one or more parameters comprises source beam uniformity of the source and the relative alignment of the sub-beams.

Clause 74. The charged particle assessment apparatus of any of clauses 71 to 73 further comprising a controller configured to control the device so as to assess the surface of the sample after exposure and after processing and to receive and process a detection signal from the detector so as to assess the one or more parameters.

Clause 75. The charged particle assessment apparatus of clause 74, wherein the processor is configured to compare detection signals representative of a feature in the surface of the sample with a control or a different feature in the surface of the sample so as to determine the one or more parameters.

The invention claimed is:

1. A charged particle device for a charged particle inspection apparatus for projecting an array of sub-beams towards a sample, the charged particle device comprising:

an up-beam charged particle optical element comprising an up-beam surface in which is defined a plurality of apertures through the charged particle element configured for alignment with paths of a plurality of beams, the plurality of beams comprising an array of sub-beams and a monitoring beam; and a down-beam charged particle optical element in which are defined a plurality of apertures configured for alignment with openings defined in the up-beam charged particle optical element, the apertures comprising:

at least one sub-beam aperture through the charged particle element and configured for the paths of the array of sub-beams towards a position of the sample; and a monitoring aperture configured for monitoring the monitoring beam; and a detector comprised within the monitoring aperture and configured to measure a parameter of the corresponding monitoring beam.

2. The charged particle device of claim 1, wherein the detector is configured for alignment with a path of the monitoring beam.

3. The charged particle device of claim 1, wherein the monitoring aperture is blind.

4. The charged particle device of claim 1, wherein the monitoring aperture extends through the down-beam charged particle optical element.

5. The charged particle device of claim 1, further comprising an upper charged particle optical member positioned between up-beam charged particle optical element and the down-beam charged particle optical element, the charged particle optical member comprising an aperture for each of the plurality of beams.

6. The charged particle device of claim 1, further comprising a lower charged particle optical member positioned between down-beam charged particle optical element and the sample position, the lower charged particle optical member comprising an aperture corresponding to each sub-beam of the sub-beam array.

7. The charged particle device of claim 1, wherein the plurality of beams comprise an array of monitoring beams and in a down-beam aperture array is defined a plurality of the monitoring apertures, the device further comprising an array of the detectors corresponding to the monitoring beams.

8. The charged particle device of claim 7, wherein the array of monitoring beams are radially outward of the array of sub-beams and/or the monitoring apertures are radially outward of the sub-beam apertures.

9. The charged particle device of claim 1, wherein the monitoring aperture is radially outward of the sub-beam apertures.

10. The charged particle device of claim 1, wherein the diameter of the monitoring aperture is greater than, or substantially equal to, the diameter of the sub-beam apertures.

11. The charged particle device of claim 1, wherein the down beam charged particle optical element comprises the array of detectors.

12. The charged particle device of claim 1, wherein the up-beam charged particle optical element and the down-beam charged particle optical element are comprised in a lens array, desirably the elements are separated by an isolating member.

13. The charged particle device of claim 1, wherein the up-beam charged particle optical element and the down-beam charged particle optical element are respectively comprised in different electron-optical components positioned apart along paths of the sub-beams.

14. The charged particle device of claim 1, wherein the upbeam and/or down-beam charged particle element is a lens electrode.

15. The charged particle device of claim 1, wherein the parameter corresponds to source beam uniformity, brightness and/or emission strength of the source beam and/or alignment between the array of sub-beams and a charged particle optical element.

* * * * *